US012804845B2

(12) United States Patent
Natarajan et al.

(10) Patent No.: US 12,804,845 B2
(45) Date of Patent: Nov. 17, 2026

(54) SYSTEMS, DEVICES, AND METHODS FOR IMPROVING HEAT DISSIPATION

(71) Applicant: VERTIV CORPORATION, Westerville, OH (US)

(72) Inventors: Srinivasan Natarajan, Erode (IN); Manoj Paithane, Pune (IN); Utkarsh Diliprao Charapale, Kolhapur (IN); Tushar Survase, Pune (IN)

(73) Assignee: Vertiv Corporation, Westerville, OH (US)

( * ) Notice: Subject to any disclaimer, the term of this patent is extended or adjusted under 35 U.S.C. 154(b) by 244 days.

(21) Appl. No.: 18/661,559

(22) Filed: May 10, 2024

(65) Prior Publication Data

US 2025/0351291 A1 Nov. 13, 2025

(51) Int. Cl.
*H05K 7/20* (2006.01)

(52) U.S. Cl.
CPC ..... *H05K 7/20145* (2013.01); *H05K 7/20154* (2013.01)

(58) Field of Classification Search
CPC ....... G06F 1/20; G06F 1/206; H05K 7/20727; H05K 7/20145; H05K 7/20154; H05K 1/0203; H05K 13/04; H05K 2201/066; H05K 7/20136; H05K 7/20163; H05K 7/2039; H05K 7/205; H05K 7/20563; H05K 7/20772; H05K 7/20781; H05K 7/209; H05K 7/20909; H10W 40/43
See application file for complete search history.

(56) References Cited

U.S. PATENT DOCUMENTS

| | | | | |
|---|---|---|---|---|
| 10,054,993 | B2 * | 8/2018 | Yi | H05K 7/20154 |
| 2002/0071250 | A1 * | 6/2002 | Shih | G06F 1/20 361/695 |
| 2005/0047105 | A1 * | 3/2005 | Gedamu | H10W 40/43 257/E23.105 |
| 2007/0235168 | A1 * | 10/2007 | Chen | H05K 7/20727 257/E23.099 |
| 2008/0041562 | A1 * | 2/2008 | Bhatia | H10W 40/43 257/E23.099 |
| 2010/0302730 | A1 * | 12/2010 | Hernon | H05K 7/20145 165/185 |
| 2019/0053401 | A1 | 2/2019 | Chang et al. | |
| 2024/0130072 | A1 * | 4/2024 | Andersen | H05K 7/20145 |

OTHER PUBLICATIONS

Extended European Search Report dated Sep. 25, 2024 for EP Application 24175042.1 filed May 9, 2024.

* cited by examiner

*Primary Examiner* — Michael A Matey
(74) *Attorney, Agent, or Firm* — Mackey Law Firm PLLC

(57) ABSTRACT

A system for heat dissipation in an electronic equipment housing having a heat generating device therein can include a fan configured to induce air flow through the housing, a heat sink thermally coupled to the heat generating device, and a diverter positioned to direct at least a portion of the air flow into the heat sink.

20 Claims, 22 Drawing Sheets

Air Bypass Between Heatsinks

SYSTEMS, DEVICES, AND METHODS FOR IMPROVING HEAT DISSIPATION

CROSS-REFERENCE TO RELATED APPLICATIONS

This application claims the benefit of Indian Provisional Patent Application No. 202321033033 filed May 10, 2023, the entire contents of which are incorporated herein by reference.

BACKGROUND OF THE INVENTION

Field of the Invention

The present disclosure relates generally to electronic equipment cabinets and more specifically relates to heat dissipation in electronic equipment cabinets.

Description of the Related Art

Typical electronic equipment includes internal components that generate significant heat, and therefore have fans to draw cooling air through their housings. For example, typical rack mounted computer equipment includes central processing units (CPUs) and/or graphics processing units (GPUs). Particularly hot, and/or heat sensitive, devices may have heat sinks to better dissipate heat. However, cooling air may only thermally couple with a portion of these heat sinks and/or a portion of the cooling air may disperse or otherwise traverse the housing without thermally coupling with a heat sink, thereby leading to inefficiencies.

SUMMARY OF THE INVENTION

Applicants have created new and useful devices, systems and methods for improving heat dissipation. In at least one embodiment, a system for improved heat dissipation can include an electronic equipment housing having a heat generating device therein, a fan configured to induce air flow through the housing, a heat sink thermally coupled to the heat generating device, and a diverter positioned to direct at least a portion of the air flow into the heat sink. In at least one embodiment, the diverter can be V-shaped and/or have a V-shaped cross-section. In at least one embodiment, the diverter can be vertically or horizontally oriented. In at least one embodiment, the diverter can be oriented at an angle with respect to a vertical and/or horizontal axis of the housing.

In at least one embodiment, a system for improved heat dissipation can include a second heat generating device within the housing and a second heat sink thermally coupled to the second heat generating device. In at least one embodiment, the diverter can also direct at least a second portion of the air flow into the second heat sink.

In at least one embodiment, a system for improved heat dissipation can include a second and/or third diverter positioned between the first heat sink and the second heat sink. In at least one embodiment, the first diverter can be positioned upstream, in the air flow, from the second diverter. In at least one embodiment, the second diverter can be positioned upstream, in the air flow, from the third diverter. In at least one embodiment, the second diverter can be longer than the first diverter. In at least one embodiment, the third diverter can be longer than the second diverter.

In at least one embodiment, the second diverter can be configured to direct at least a third portion of the air flow into the first heat sink and direct at least a fourth portion of the air flow into the second heat sink. In at least one embodiment, the second diverter can be configured to direct the first portion of the air flow along the first heat sink. In at least one embodiment, the third diverter can be configured to direct the second portion of the air flow along the second heat sink.

In at least one embodiment, a system for improved heat dissipation can include a second heat sink thermally coupled to the first heat generating device. In at least one embodiment, a system for improved heat dissipation can include a second heat generating device within the housing, with a third heat sink thermally coupled to the second heat generating device and/or a fourth heat sink thermally coupled to the second heat generating device. In at least one embodiment, the first diverter can be configured to also direct at least a second portion of the air flow into the third heat sink.

In at least one embodiment, a system for improved heat dissipation can include a second diverter positioned between the first heat sink and the third heat sink. In at least one embodiment, a system for improved heat dissipation can include a third diverter configured to direct at least a third portion of the air flow into the second heat sink. In at least one embodiment, a system for improved heat dissipation can include a fourth diverter configured to direct at least a fourth portion of the air flow into the fourth heat sink.

DETAILED DESCRIPTION OF THE INVENTION

Figure 1:
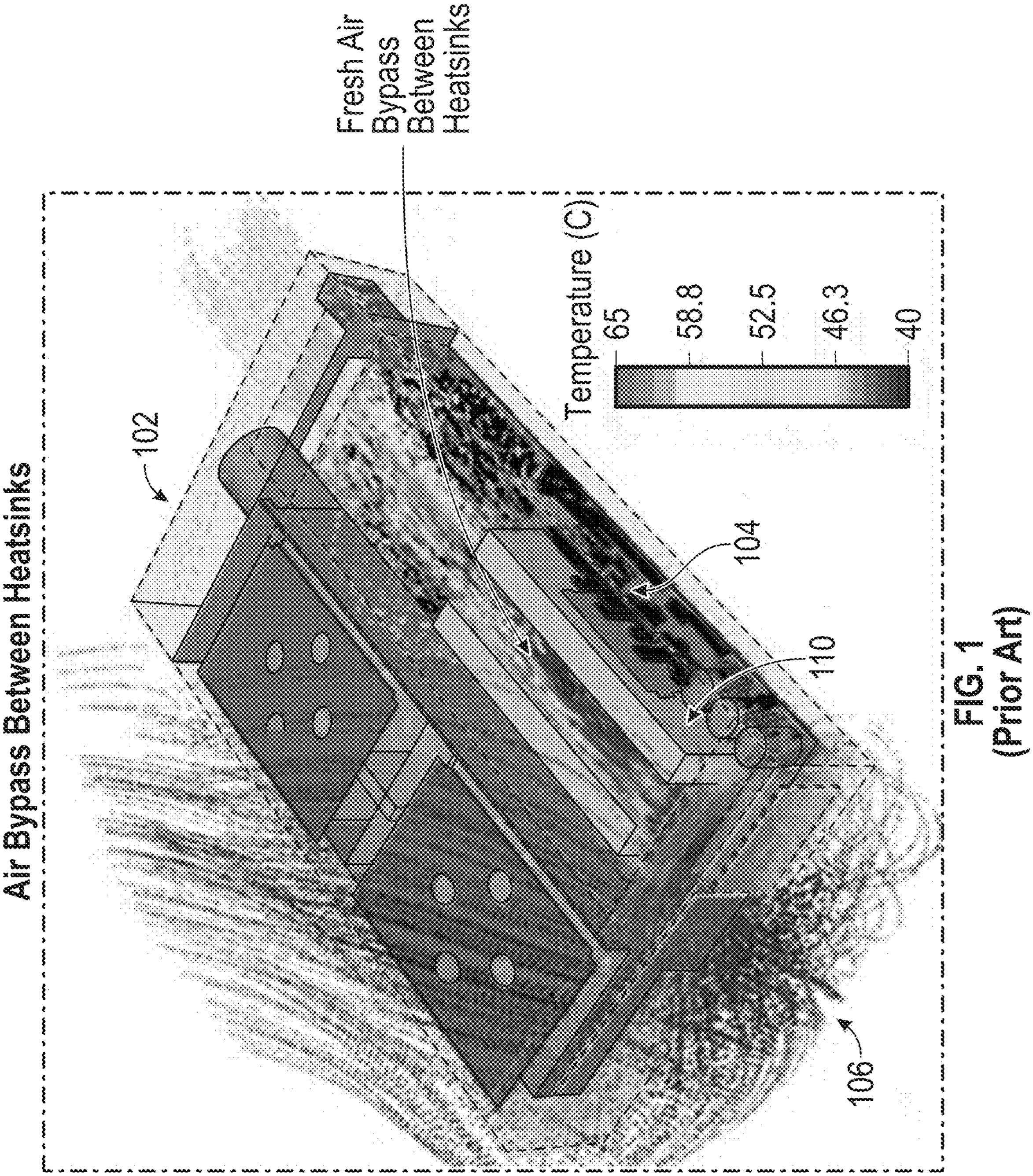
FIG. 1 (Prior Art)
FIG. 1 is a perspective view of one of many electronic equipment modules that can benefit from the present disclosure.

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms.

The use of a singular term, such as, but not limited to, "a," is not intended as limiting of the number of items. Also, the use of relational terms, such as, but not limited to, "top," "bottom," "left," "right," "upper," "lower," "down," "up," "side," and the like are used in the written description for clarity in specific reference to the figures and are not intended to limit the scope of the inventions or the appended claims. The terms "including" and "such as" are illustrative and not limitative. The terms "couple," "coupled," "coupling," "coupler," and like terms are used broadly herein and can include any method or device for securing, binding, bonding, fastening, attaching, joining, inserting therein, forming thereon or therein, communicating, or otherwise associating, for example, mechanically, magnetically, electrically, chemically, operably, directly or indirectly with intermediate elements, one or more pieces of members together and can further include without limitation integrally forming one functional member with another in a unity fashion. The coupling can occur in any direction, including rotationally. Further, all parts and components of the disclosure that are capable of being physically embodied inherently include imaginary and real characteristics regardless of whether such characteristics are expressly described herein, including but not limited to characteristics such as axes, ends, inner and outer surfaces, interior spaces, tops, bottoms, sides, boundaries, dimensions (e.g., height, length, width, thickness), mass, weight, volume and density, among others.

Any process flowcharts discussed herein illustrate the operation of possible implementations of systems, methods, and computer program products according to various embodiments of the present disclosure. In this regard, each block in a flowchart may represent a module, segment, or portion of code, which can comprise one or more executable instructions for implementing the specified logical function (s). It should also be noted that, in some implementations, the function(s) noted in the block(s) might occur out of the order depicted in the figures. For example, blocks shown in succession may, in fact, be executed substantially concurrently. It will also be noted that each block of flowchart illustration can be implemented by special purpose hardware-based systems that perform the specified functions or acts, or combinations of special purpose hardware and computer instructions.

Applicants have created new and useful devices, systems and methods for improving heat dissipation. In at least one embodiment, a system for improved heat dissipation can include an electronic equipment housing having one or more heat generating device(s) therein, at least one fan configured to induce air flow through the housing, one or more heat sink(s) thermally coupled to the heat generating device(s), and at least one diverter positioned to direct at least a portion of the air flow into or otherwise relative to the heat sink(s) for supporting efficient and effective heat transfer.

Figure 3:
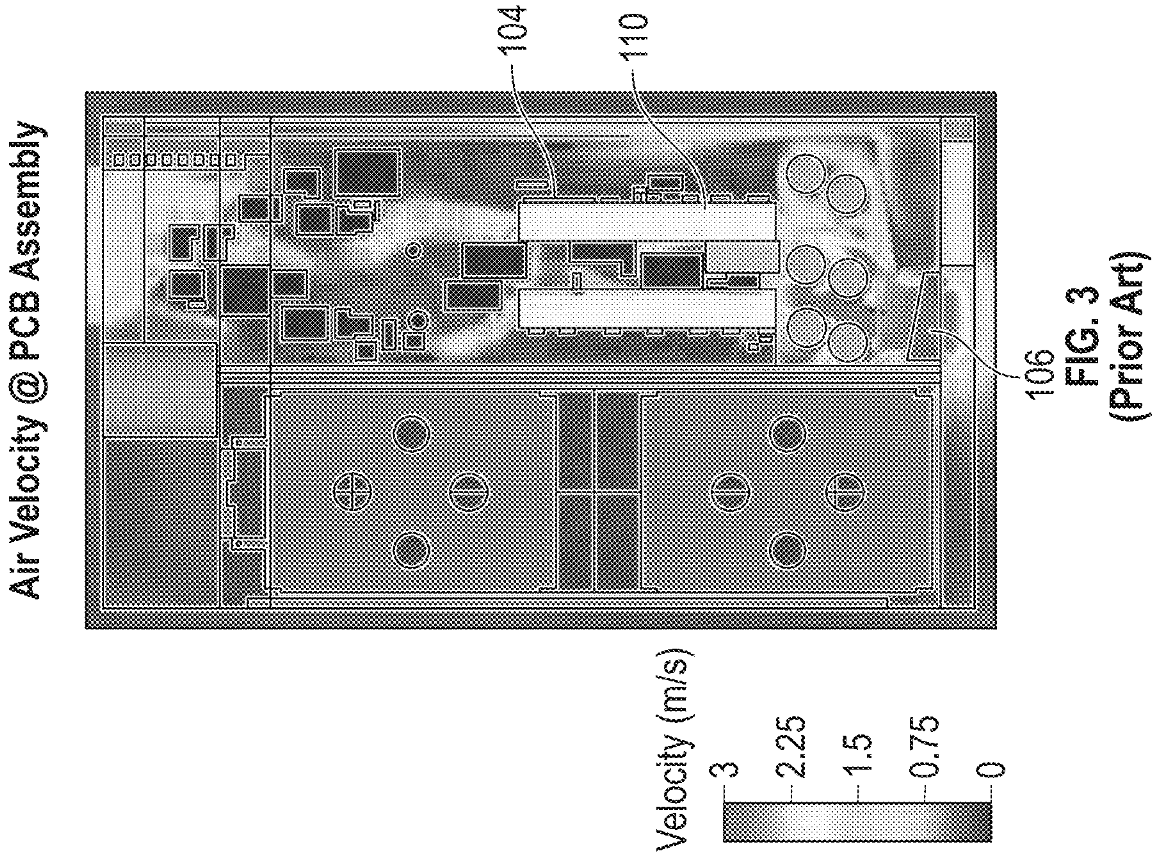
FIG. 3 (Prior Art)
FIG. 3 is an air velocity distribution map of the module of FIG. 1.
Figure 2:
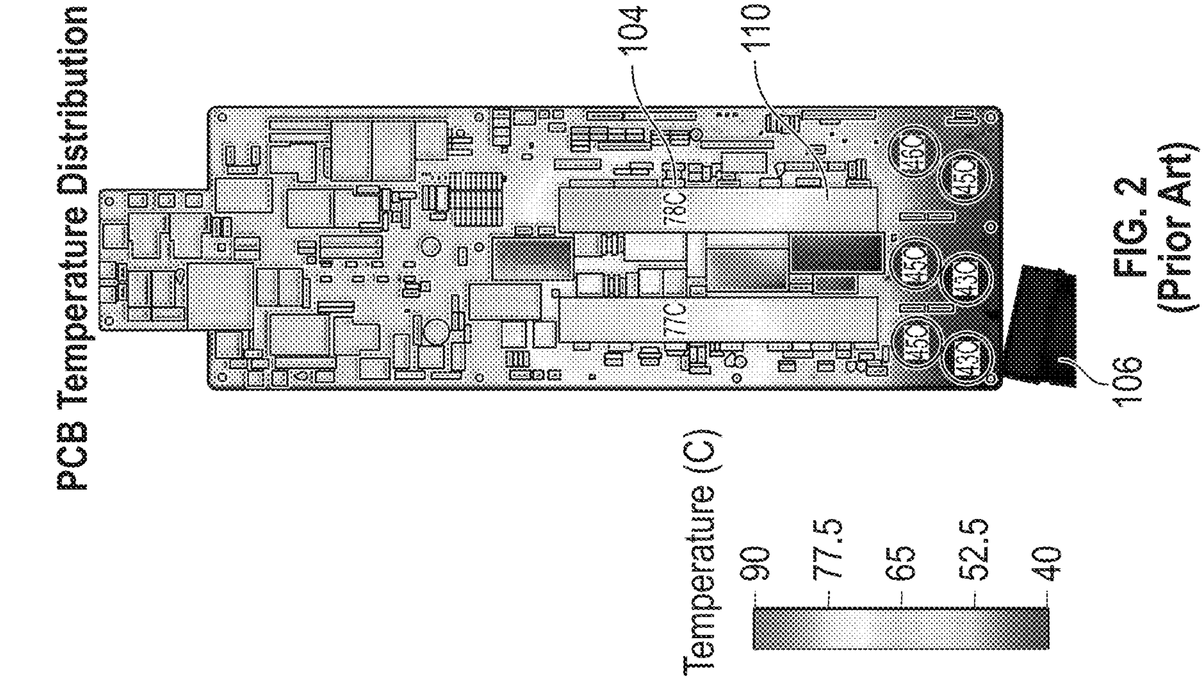
FIG. 2 (Prior Art)
FIG. 2 is a temperature distribution map of a portion of the module of FIG. 1.
Figure 5:
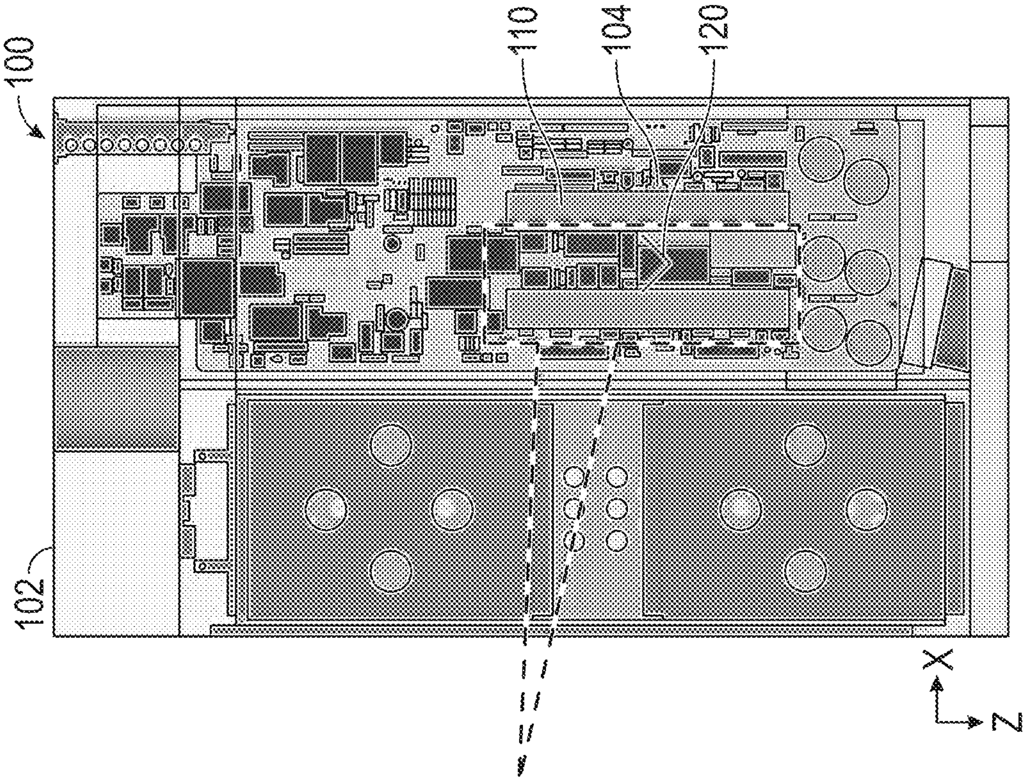
FIG. 5 is a cut-away plan view of one of many embodiments of a system for improved heat dissipation according to the disclosure.
Figure 4:
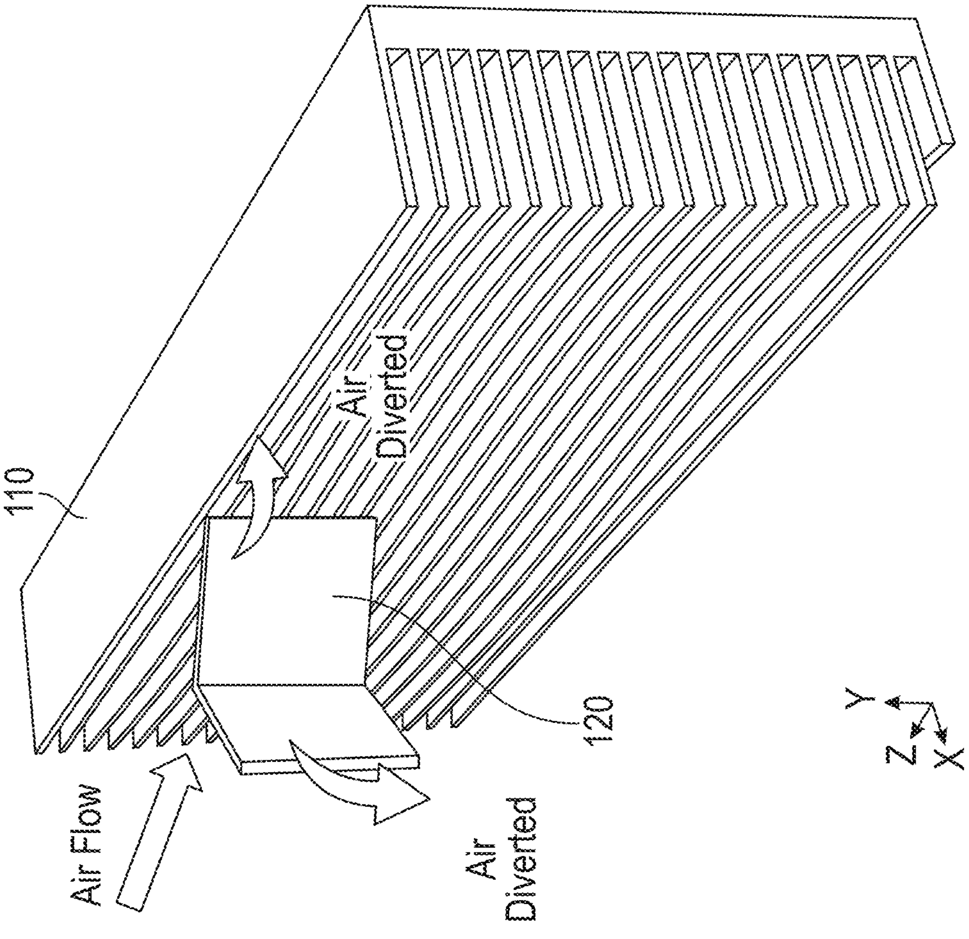
FIG. 4 is a perspective view of one of many embodiments of an air flow diverter arrangement according to the disclosure.
Figure 7:
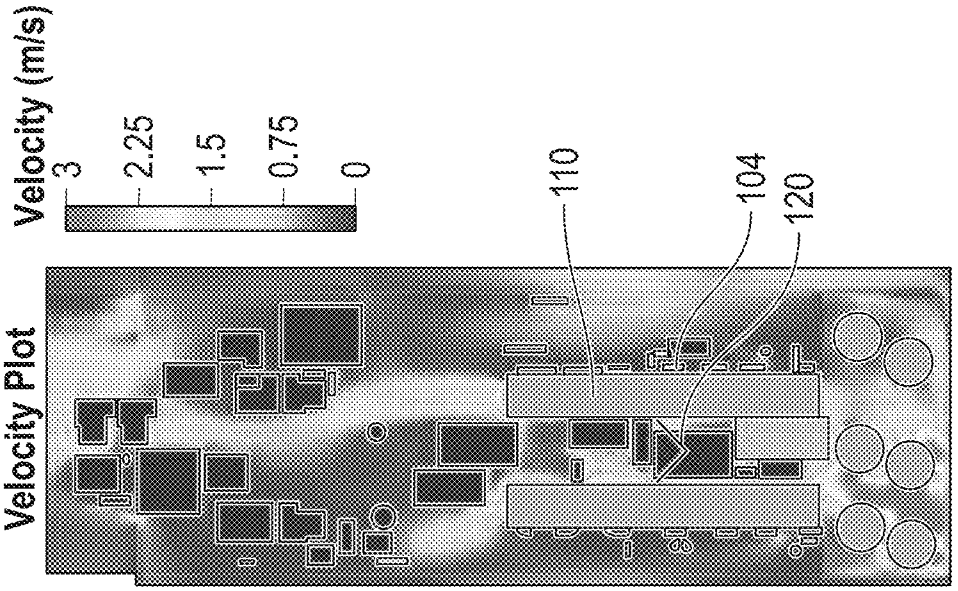
FIG. 7 is an air velocity distribution map of the system of FIG. 5.
Figure 6:
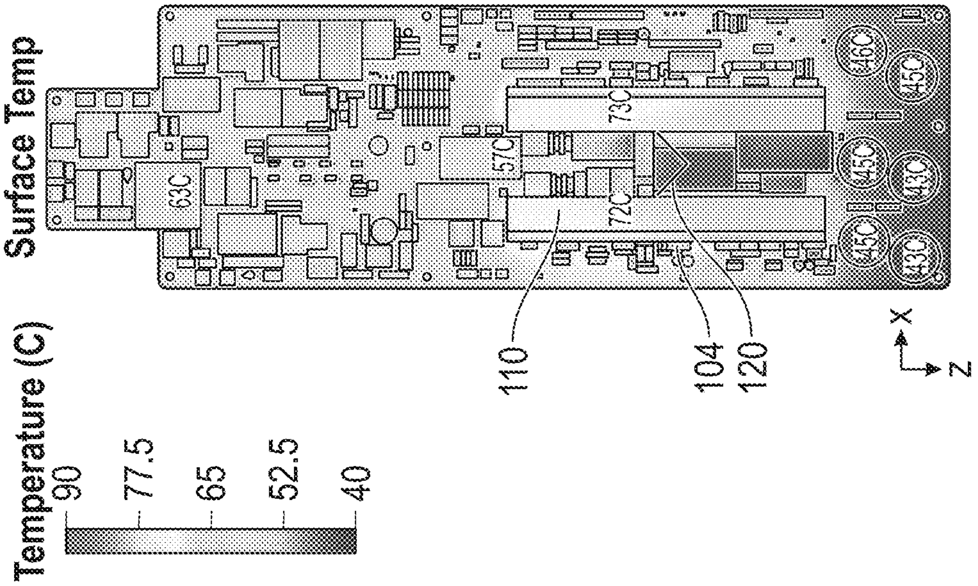
FIG. 6 is a temperature distribution map of a portion of the system of FIG. 5.
Figure 8:
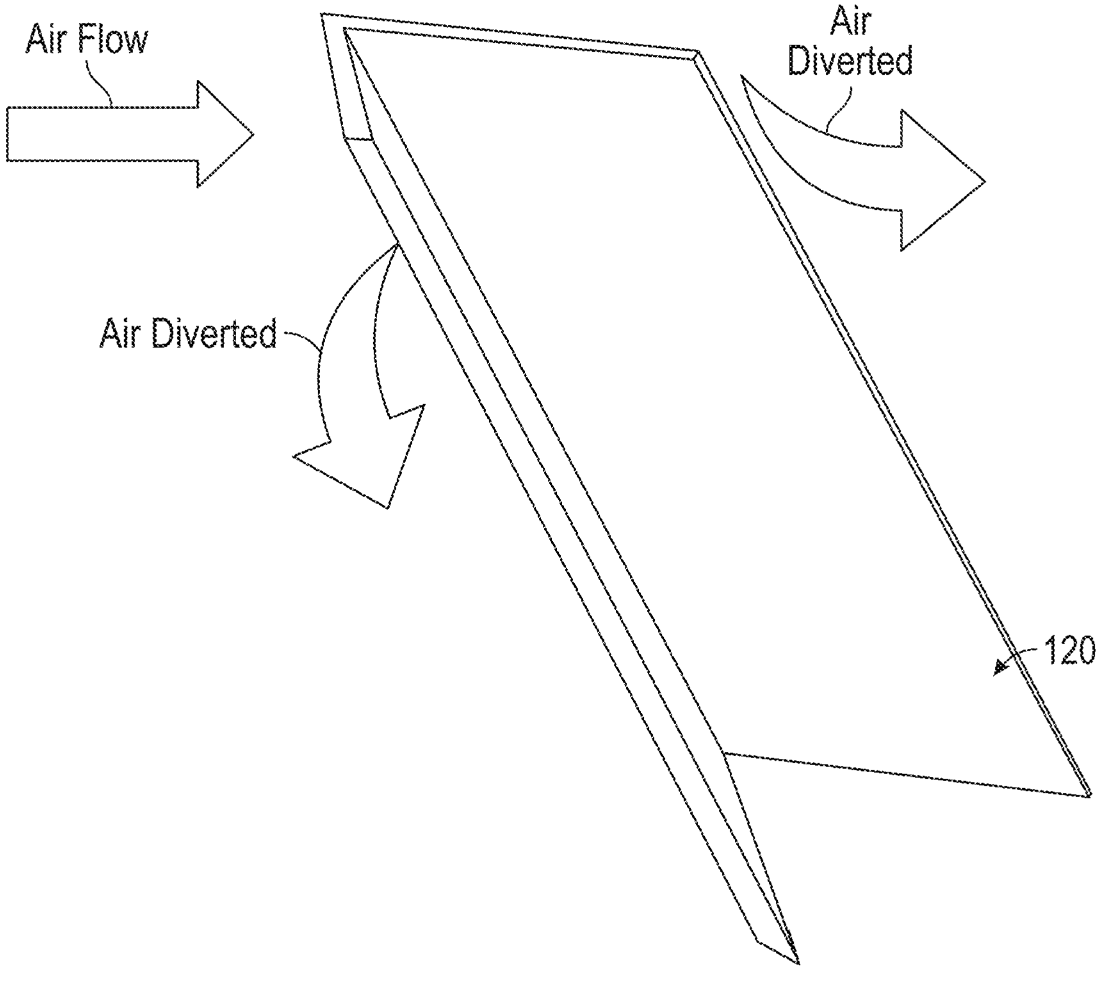
FIG. 8 is a perspective view of one of many embodiments of an air flow diverter according to the disclosure.
Figure 9:
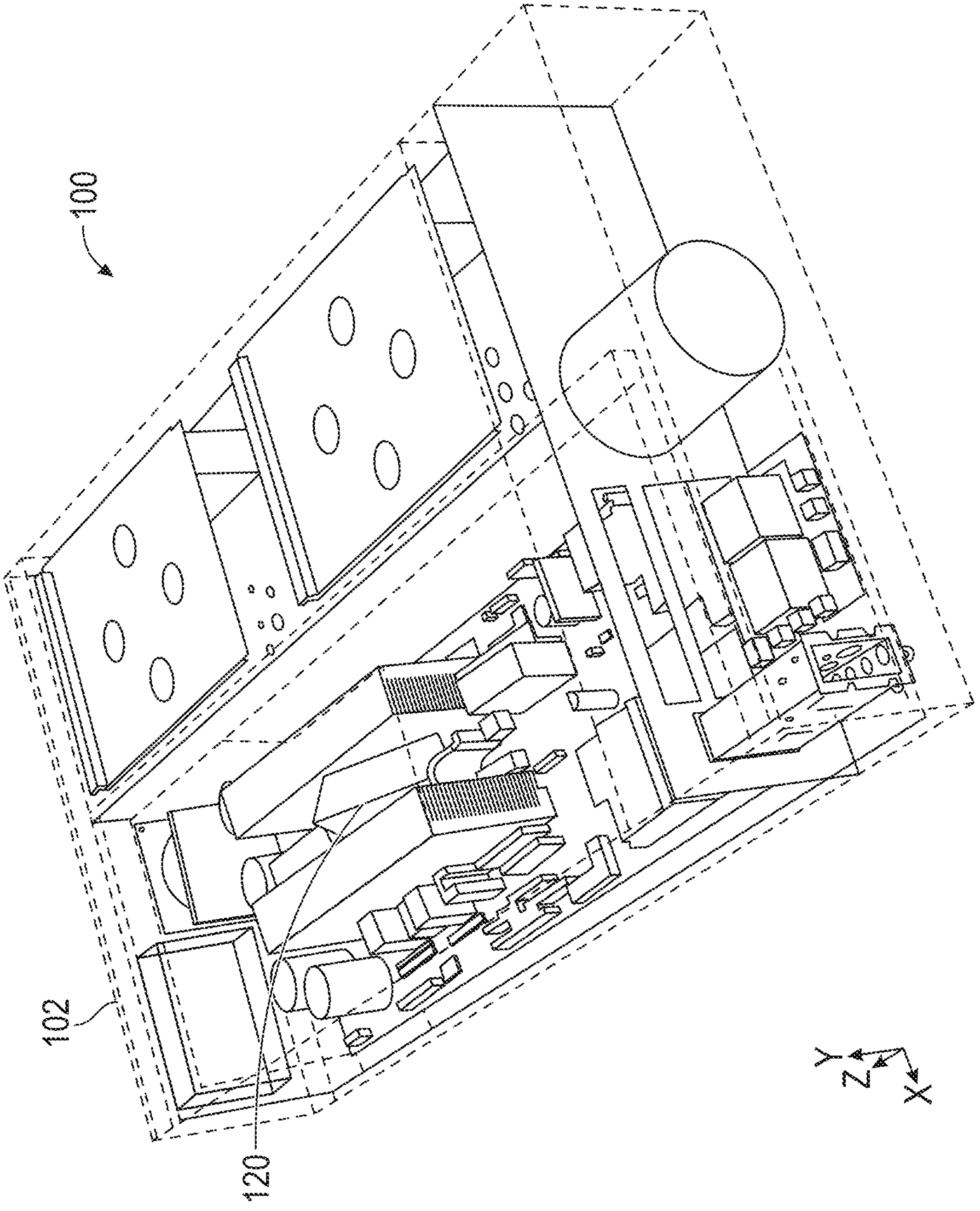
FIG. 9 is a cut-away perspective view of another one of many embodiments of a system for improved heat dissipation according to the disclosure.
Figure 10:
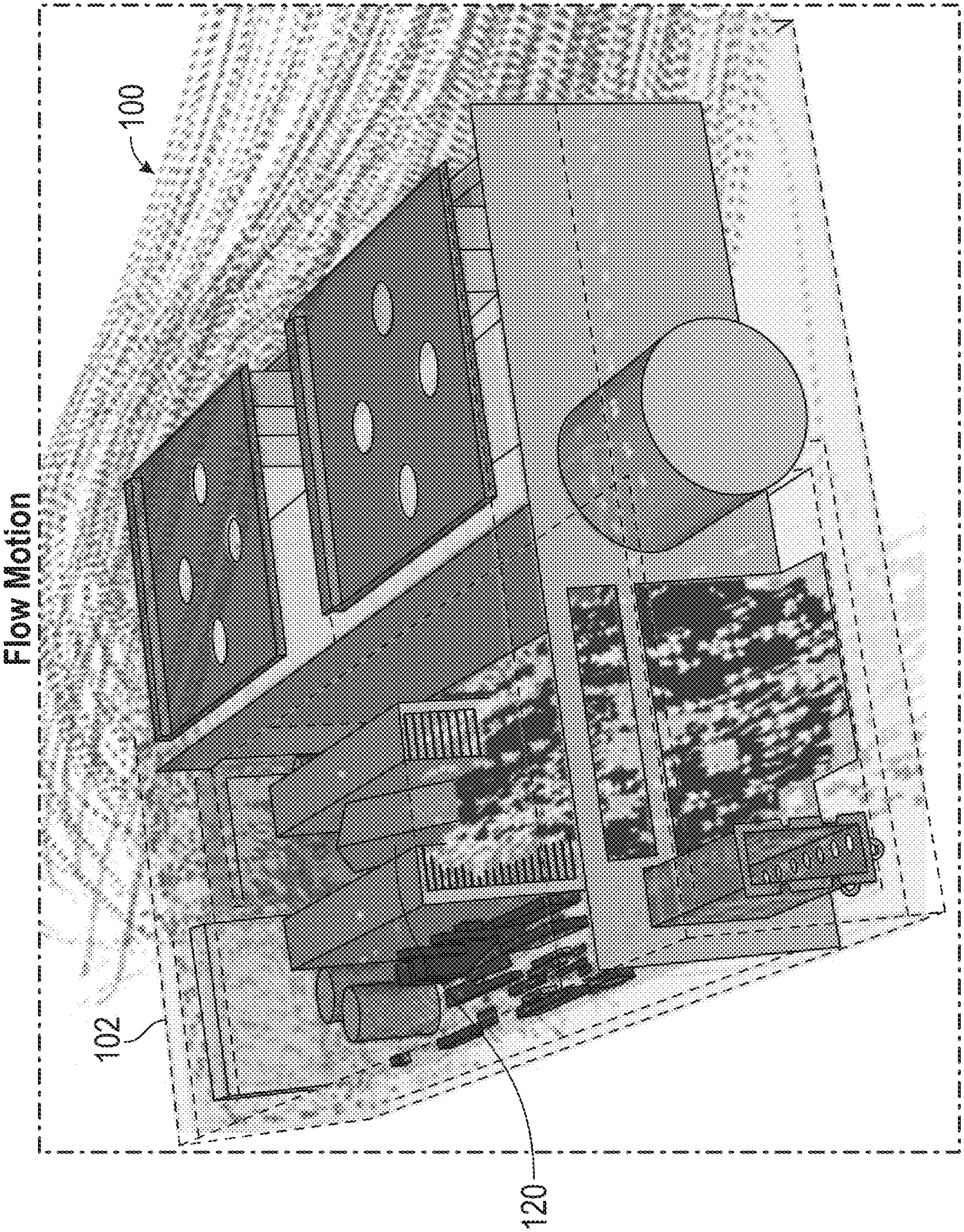
FIG. 10 is a cut-away perspective view of the system of FIG. 9, showing air flow therethrough.
Figure 11:
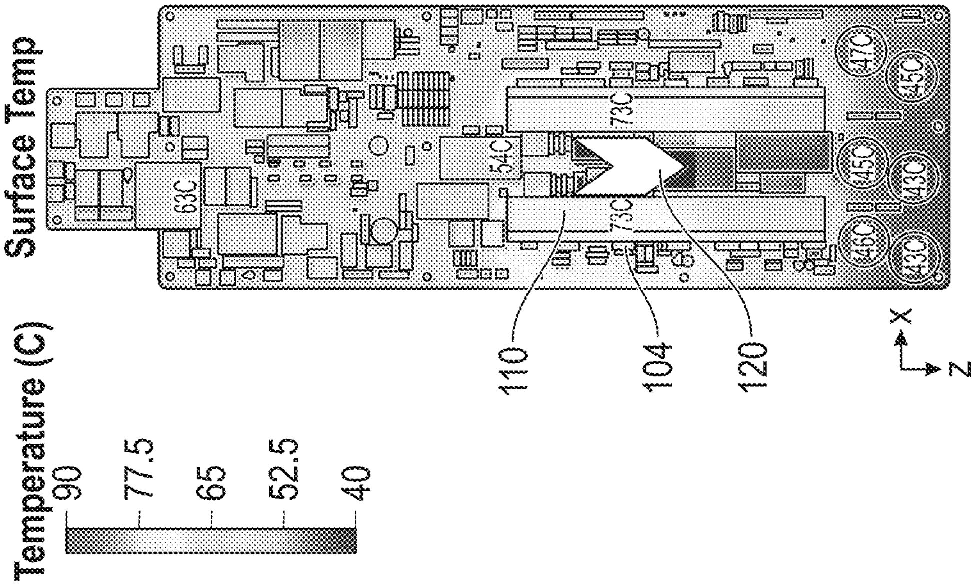
FIG. 11 is a temperature distribution map of a portion of the system of FIG. 9.
Figure 12:
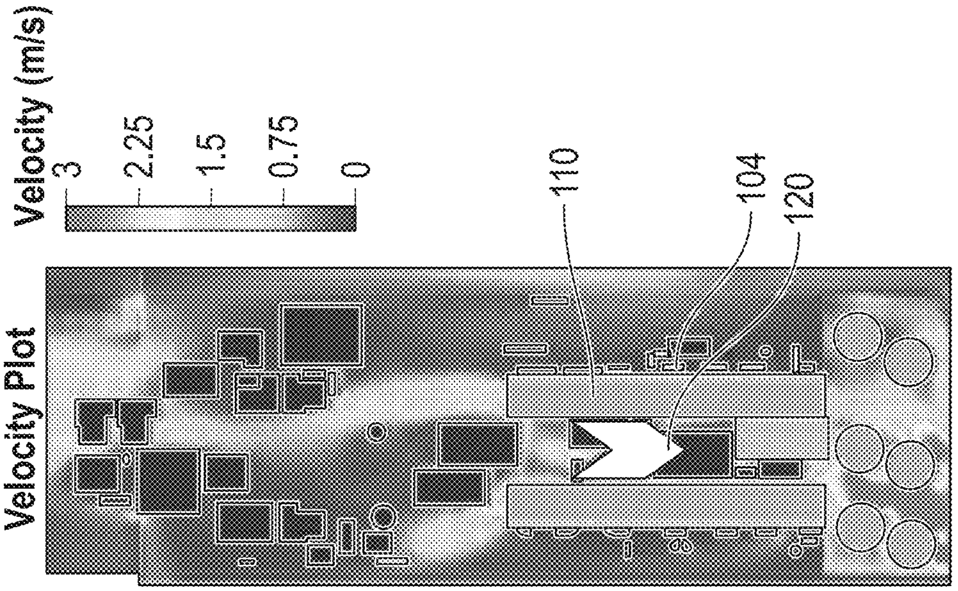
FIG. 12 is an air velocity distribution map of a portion of the system of FIG. 9.
Figure 13:
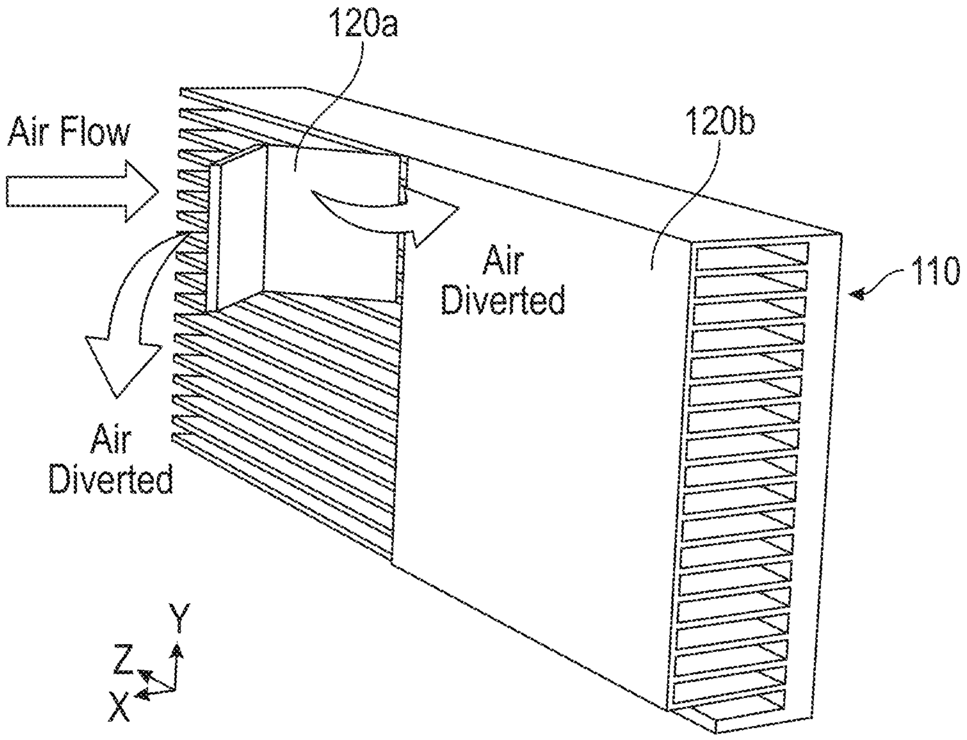
FIG. 13 is a perspective view of one of many embodiments of an air flow diverter arrangement according to the disclosure.
Figure 14:
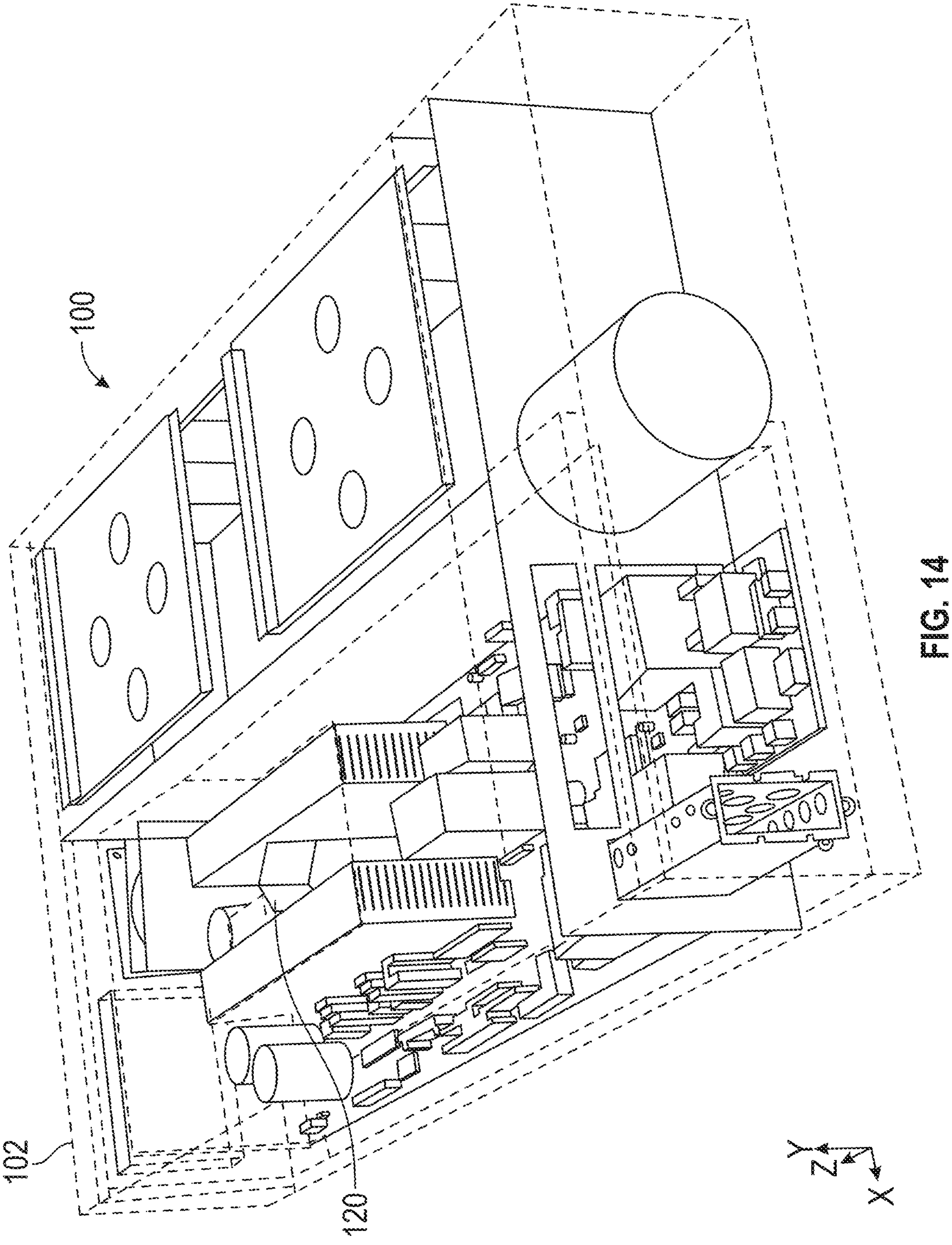
FIG. 14 is a cut-away perspective view of still another one of many embodiments of a system for improved heat dissipation according to the disclosure.
Figure 15:
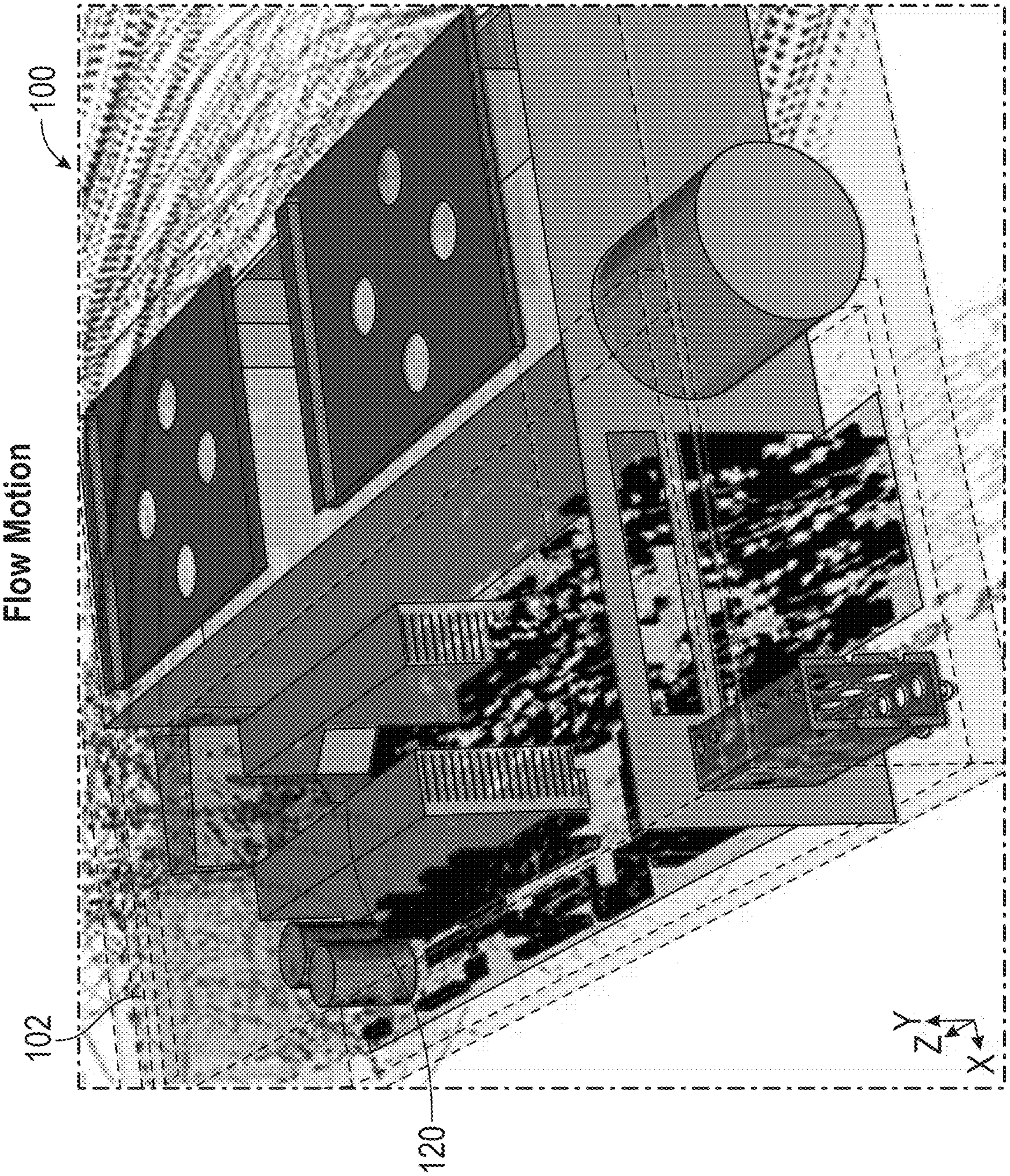
FIG. 15 is a cut-away perspective view of the system of FIG. 14, showing air flow therethrough.
Figure 17:
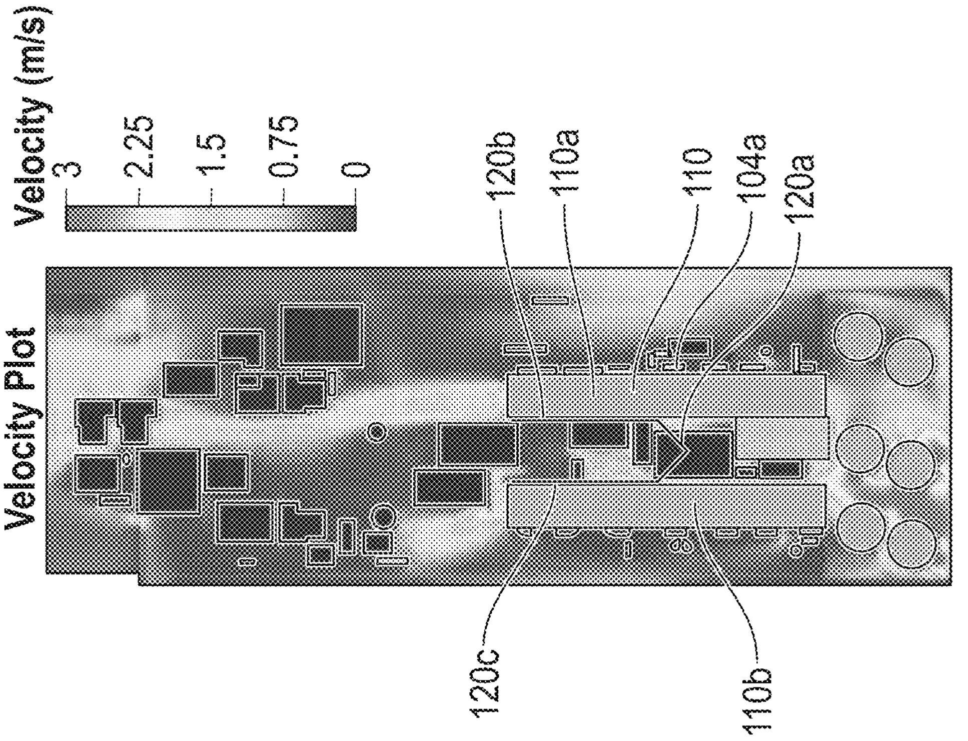
FIG. 17 is an air velocity distribution map of a portion of the system of FIG. 14.
Figure 16:
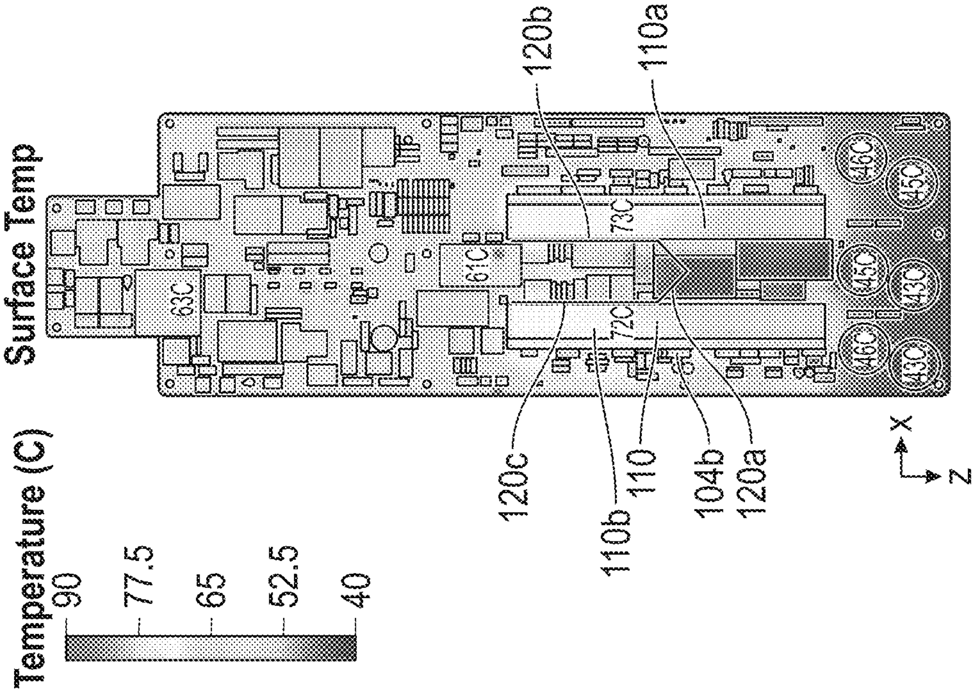
FIG. 16 is a temperature distribution map of a portion of the system of FIG. 14.
Figure 18:
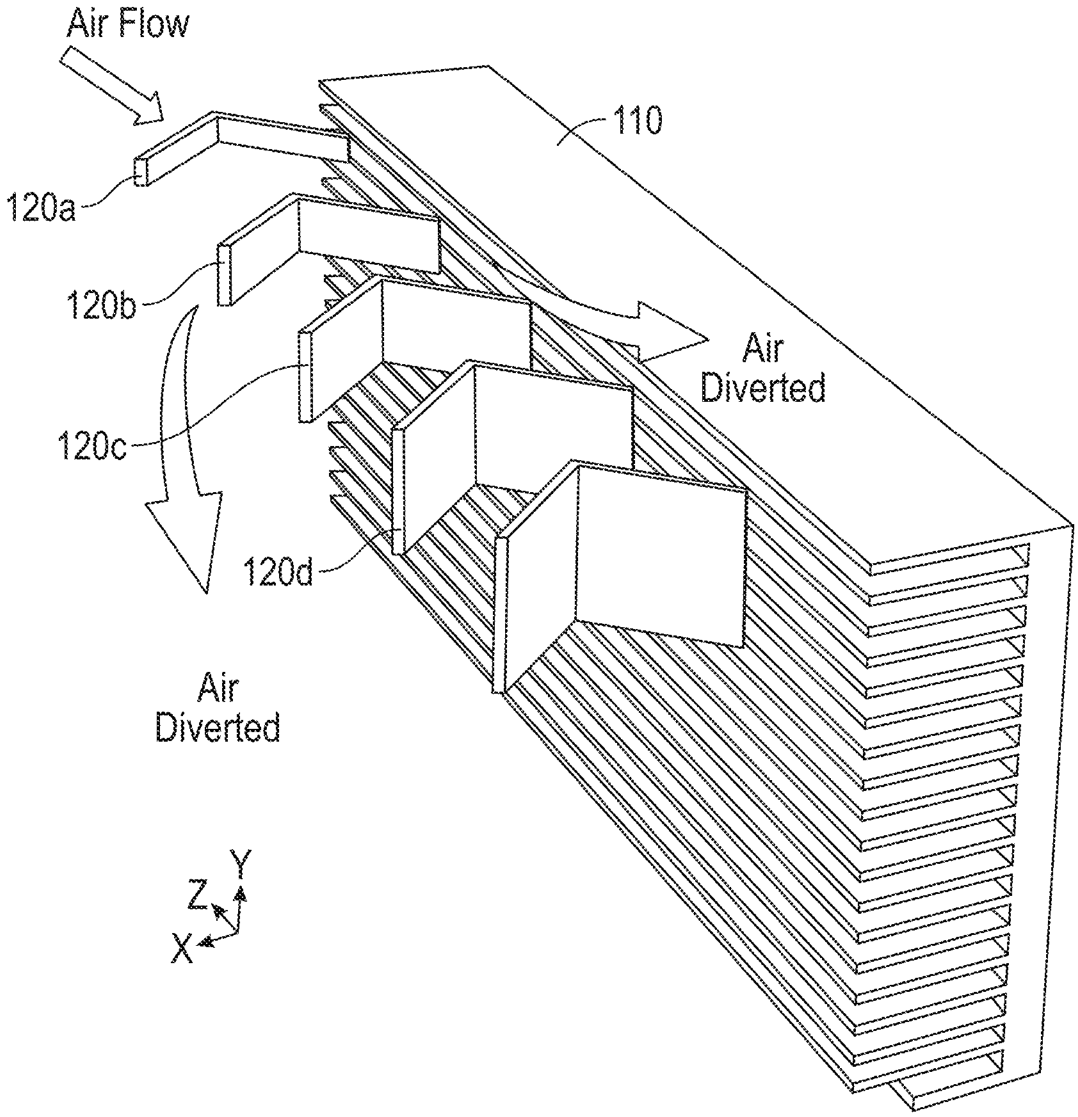
FIG. 18 is a perspective view of another one of many embodiments of an air flow diverter arrangement according to the disclosure.
Figure 19:
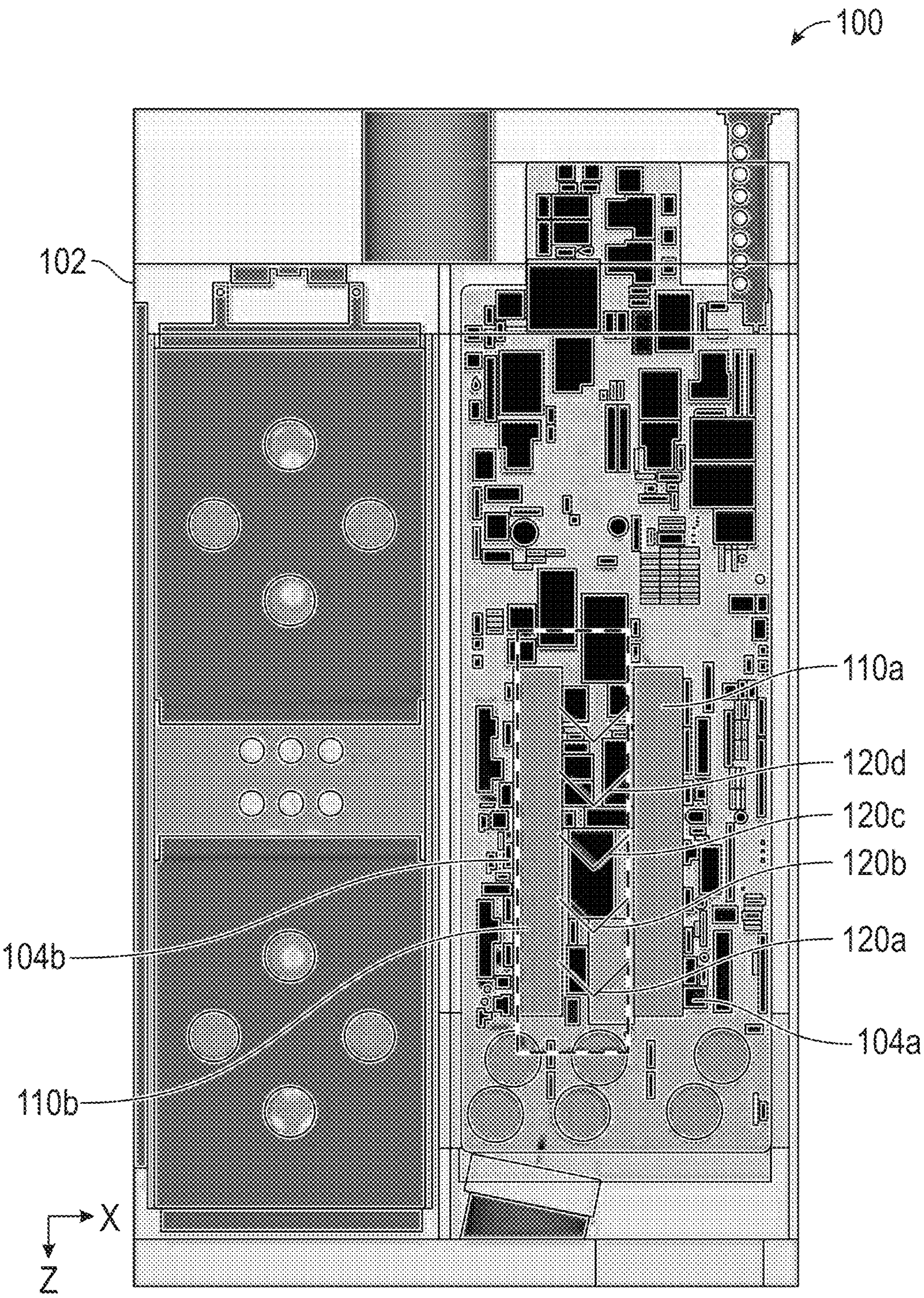
FIG. 19 is a cut-away plan view of yet another one of many embodiments of a system for improved heat dissipation according to the disclosure.
Figure 20:
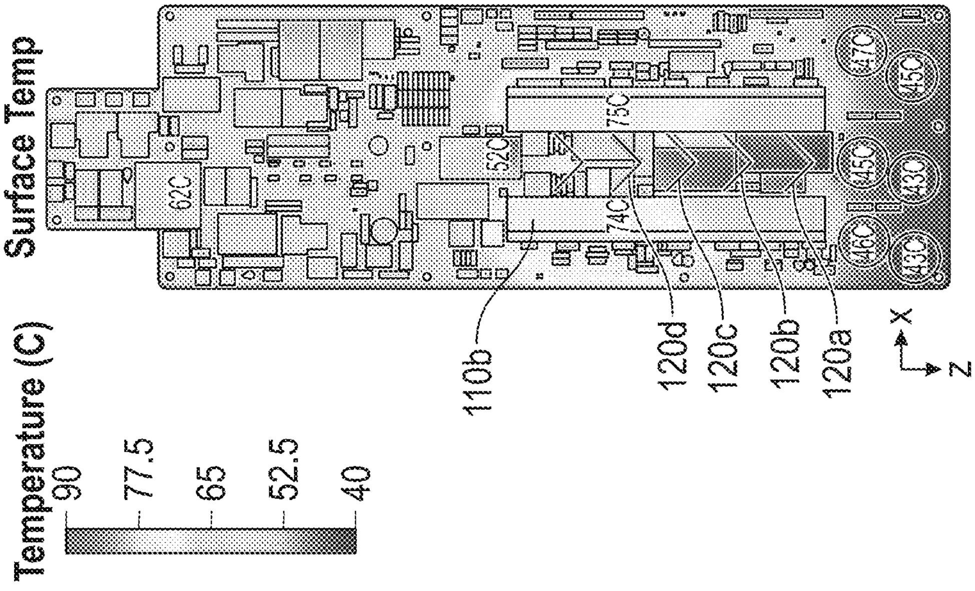
FIG. 20 is a temperature distribution map of a portion of the system of FIG. 19.
Figure 21:
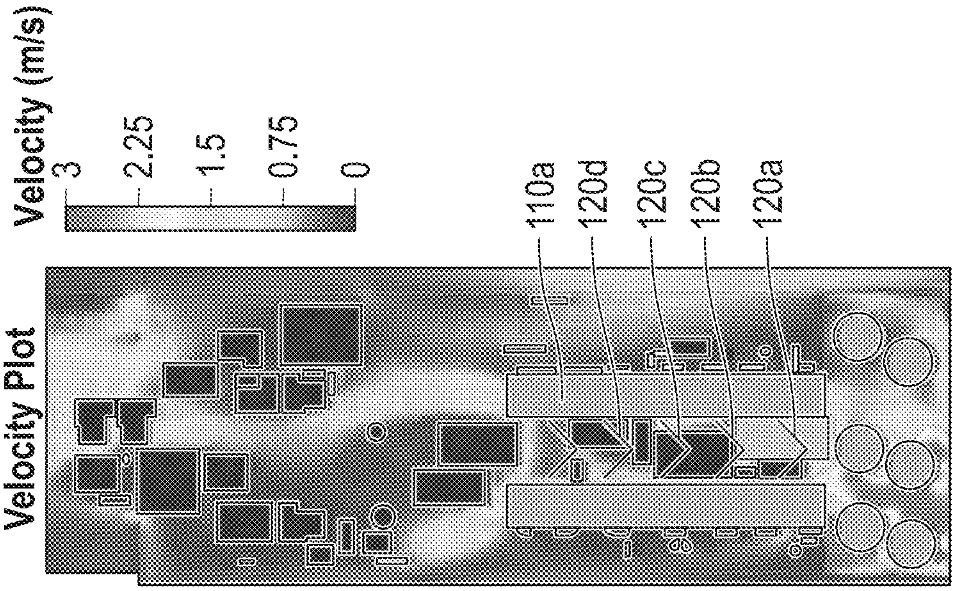
FIG. 21 is an air velocity distribution map of a portion of the system of FIG. 19.
Figure 22:
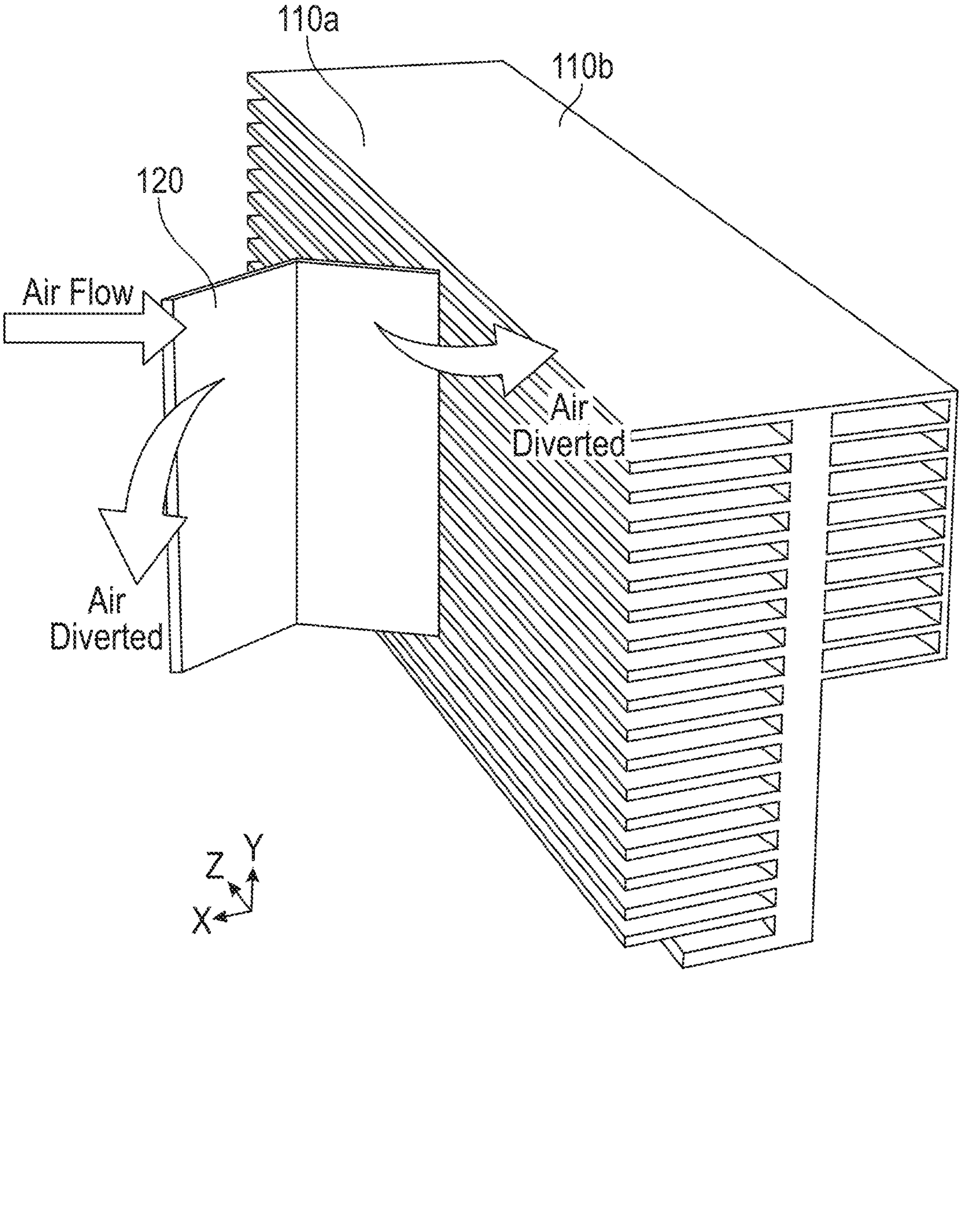
FIG. 22 is a perspective view of another one of many embodiments of an air flow diverter and heat sink arrangement according to the disclosure.
Figure 23:
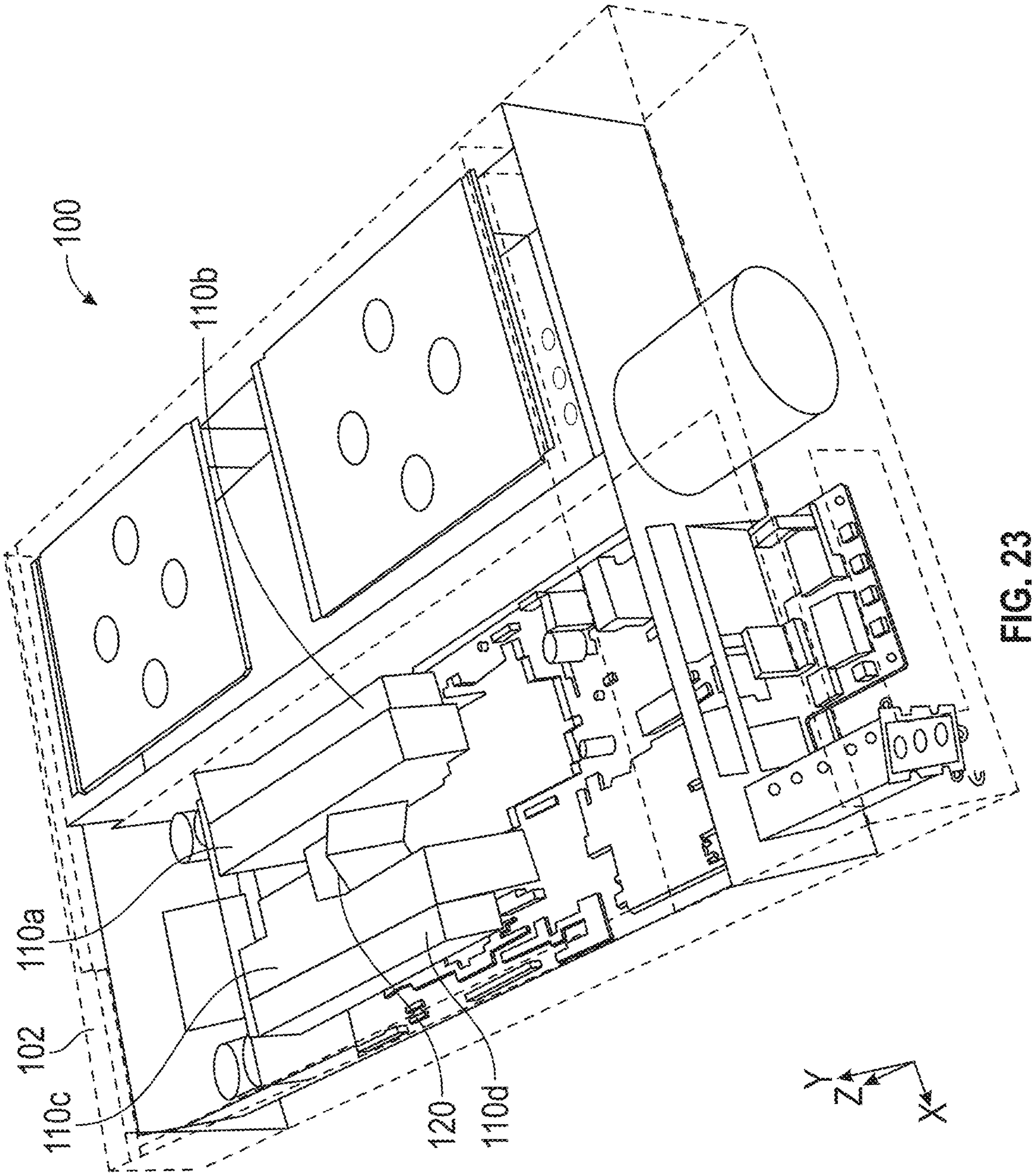
FIG. 23 is a cut-away perspective view of another one of many embodiments of a system for improved heat dissipation according to the disclosure.
Figure 24:
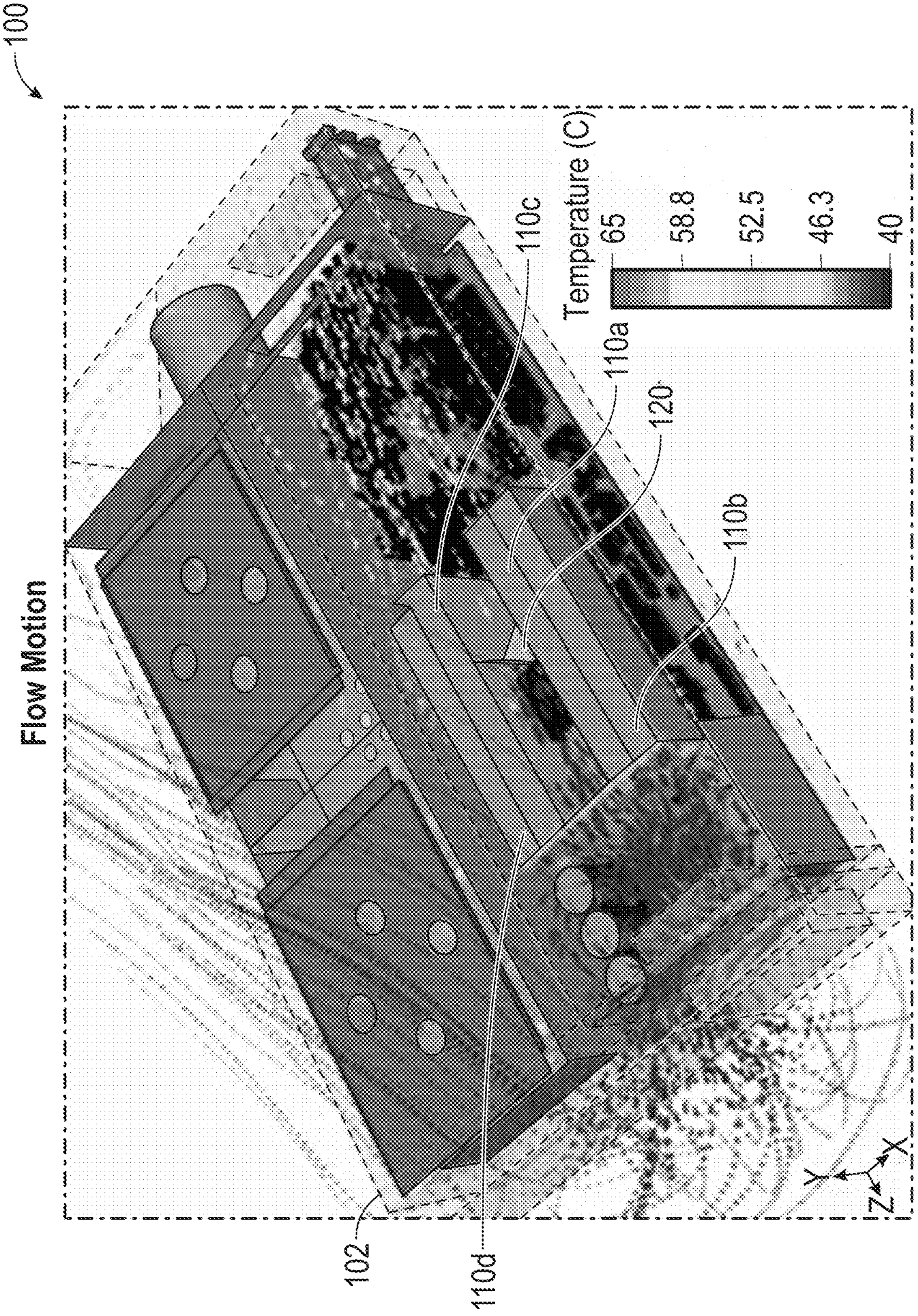
FIG. 24 is a cut-away perspective view of the system of FIG. 23, showing air flow therethrough.
Figure 26:
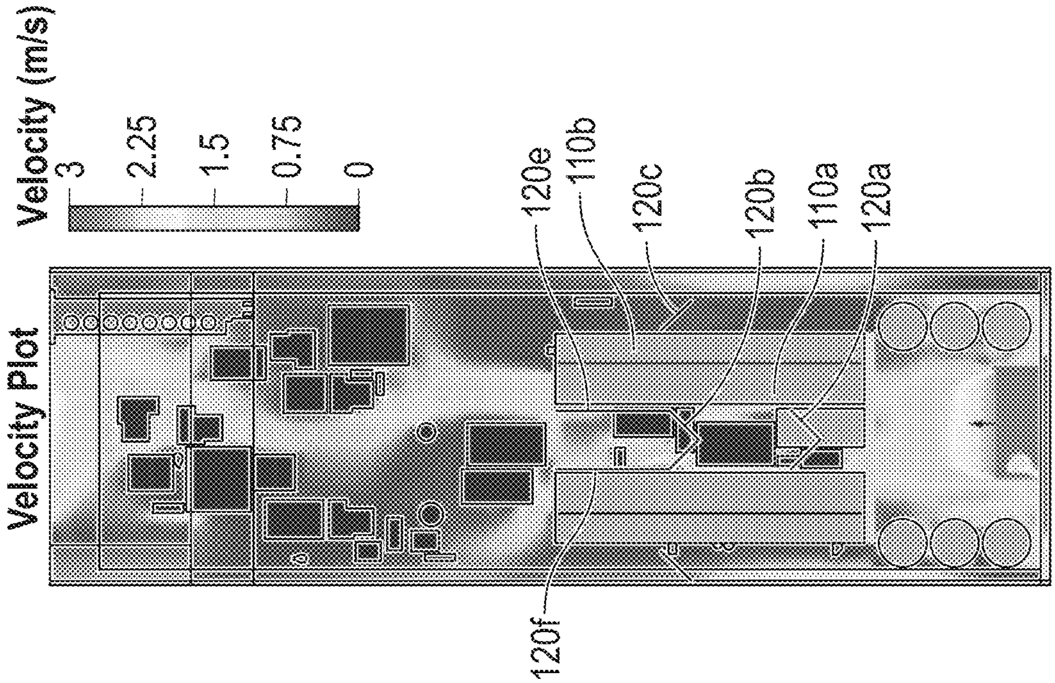
FIG. 26 is an air velocity distribution map of a portion of the system of FIG. 23.
Figure 25:
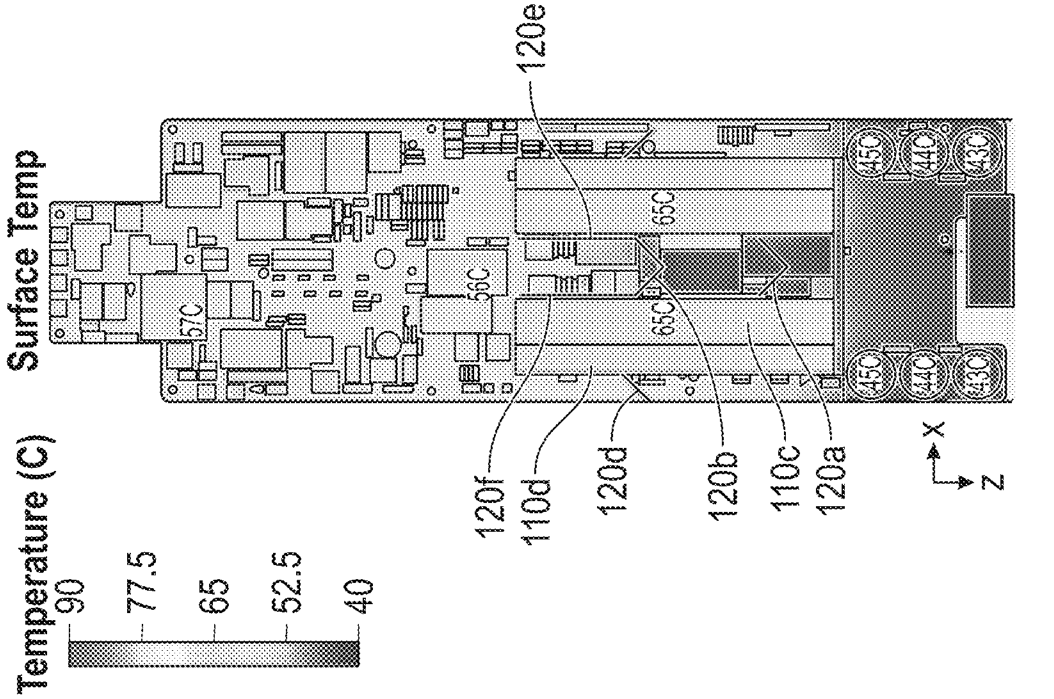
FIG. 25 is a temperature distribution map of a portion of the system of FIG. 23.
Figure 27:
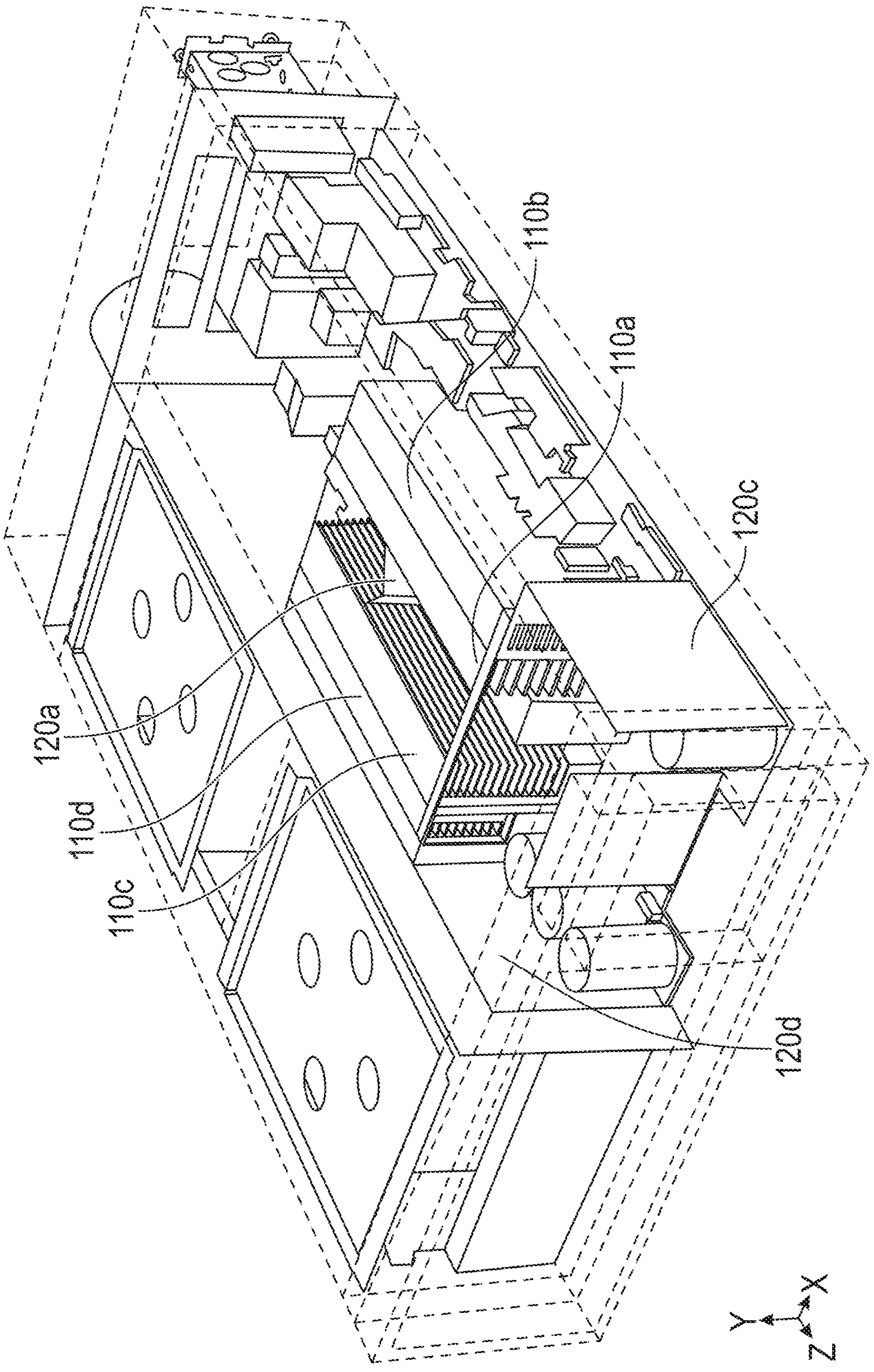
FIG. 27 is a cut-away perspective view of yet another one of many embodiments of a system for improved heat dissipation according to the disclosure.
Figure 28:
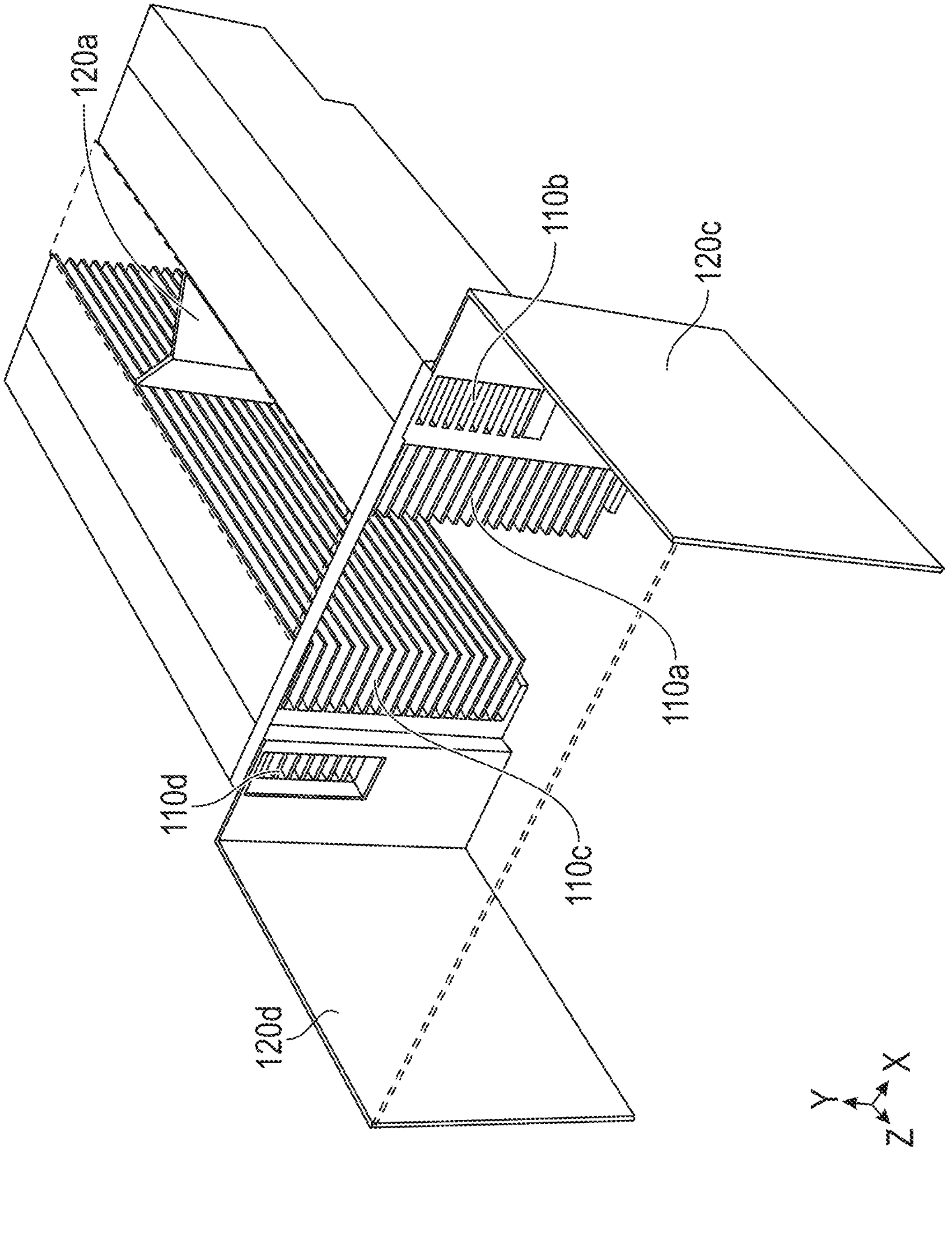
FIG. 28 is a perspective view of select components of the system of FIG. 27.
Figure 29:
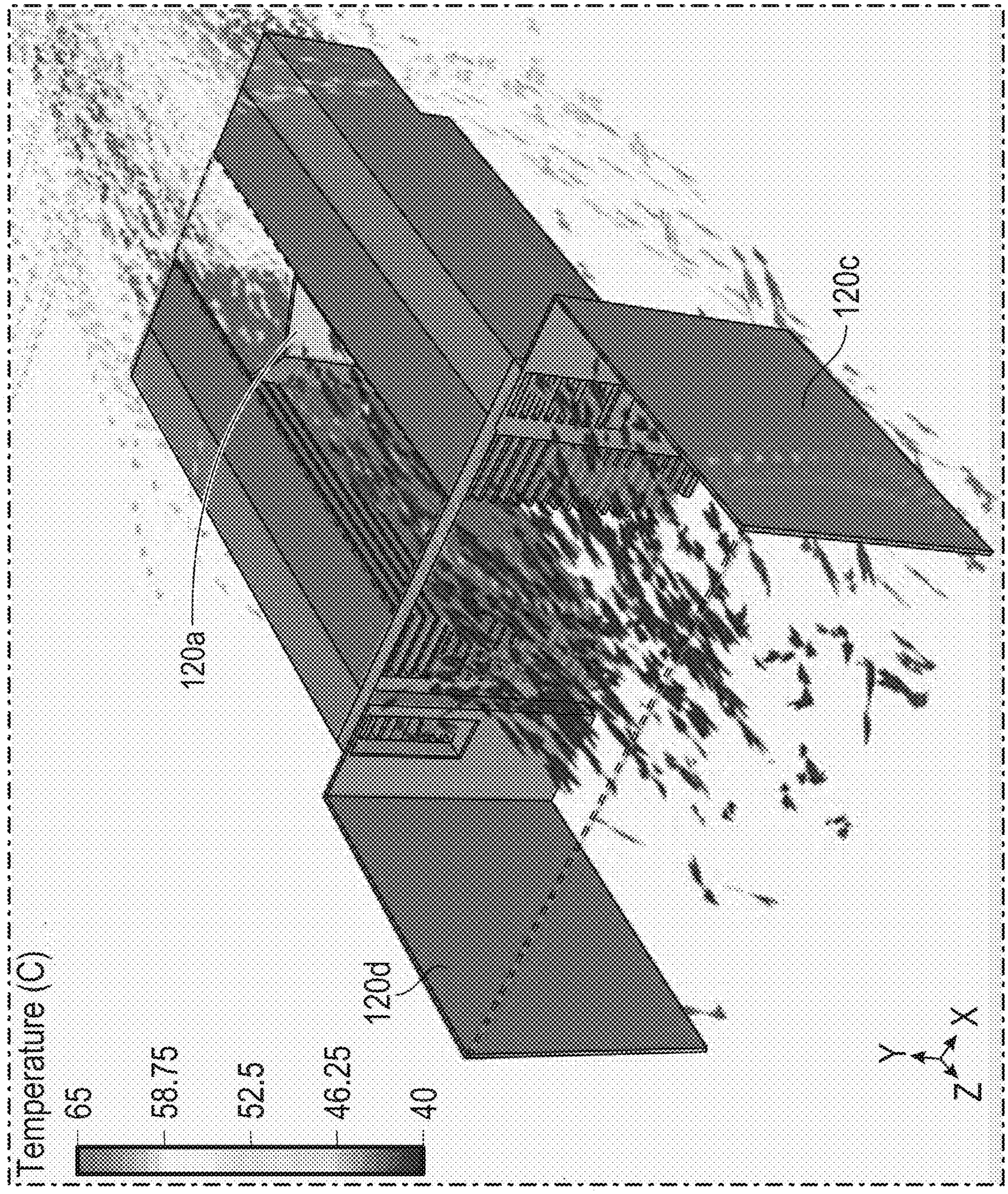
FIG. 29 is a cut-away perspective view of the system of FIG. 27, showing air flow therethrough.

FIG. 1 is a perspective view of one of many electronic equipment modules that can benefit from the present disclosure. FIG. 2 is a temperature distribution map of a portion of the module of FIG. 1. FIG. 3 is an air velocity distribution map of the module of FIG. 1. FIG. 4 is a perspective view of one of many embodiments of an air flow diverter arrangement according to the disclosure. FIG. 5 is a cut-away plan view of one of many embodiments of a system for improved heat dissipation according to the disclosure. FIG. 6 is a temperature distribution map of a portion of the system of FIG. 5. FIG. 7 is an air velocity distribution map of the system of FIG. 5. FIG. 8 is a perspective view of one of many embodiments of an air flow diverter according to the disclosure. FIG. 9 is a cut-away perspective view of another one of many embodiments of a system for improved heat dissipation according to the disclosure. FIG. 10 is a cut-away perspective view of the system of FIG. 9, showing air flow therethrough. FIG. 11 is a temperature distribution map of a portion of the system of FIG. 9. FIG. 12 is an air velocity distribution map of a portion of the system of FIG. 9. FIG. 13 is a perspective view of one of many embodiments of an air flow diverter arrangement according to the disclosure. FIG. 14 is a cut-away perspective view of still another one of many embodiments of a system for improved heat dissipation according to the disclosure. FIG. 15 is a cut-away perspective view of the system of FIG. 14, showing air flow therethrough. FIG. 16 is a temperature distribution map of a portion of the system of FIG. 14. FIG. 17 is an air velocity distribution map of a portion of the system of FIG. 14. FIG. 18 is a perspective view of another one of many embodiments of an air flow diverter arrangement according to the disclosure. FIG. 19 is a cut-away plan view of yet another one of many embodiments of a system for improved heat dissipation according to the disclosure. FIG. 20 is a temperature distribution map of a portion of the system of FIG. 19. FIG. 21 is an air velocity distribution map of a portion of the system of FIG. 19. FIG. 22 is a perspective view of another one of many embodiments of an air flow diverter and heat sink arrangement according to the disclosure. FIG. 23 is a cut-away perspective view of another one of many embodiments of a system for improved heat dissipation according to the disclosure. FIG. 24 is a cut-away perspective view of the system of FIG. 23, showing air flow therethrough. FIG. 25 is a temperature distribution map of a portion of the system of FIG. 23. FIG. 26 is an air velocity distribution map of a portion of the system of FIG. 23. FIG. 27 is a cut-away perspective view of yet another one of many embodiments of a system for improved heat dissipation according to the disclosure. FIG. 28 is a perspective view of select components of the system of FIG. 27. FIG. 29 is a cut-away perspective view of the system of FIG. 27, showing air flow therethrough. FIGS. 1-29 are described in conjunction with one another.

In at least one embodiment, a system according to the disclosure, such as a system 100 for improved heat dissipation, can include one or more electronic equipment housings 102 having one or more heat generating devices 104 therein, one or more fans 106 configured to induce air flow through the housing 102, one or more heat sinks 110 thermally coupled to the heat generating device 104, and one or more diverters 120 positioned to direct at least a portion of the air flow into or towards thermal communication with one or more of the heat sinks 110 or a portion(s) thereof. For example, one or more diverters 120 can be advantageously shaped and arranged relative to one or more heat sinks 110 for biasing air flow into channels between fins of a heat sink 110 or otherwise towards heat transfer surfaces of a heat sink 110 for supporting efficient and effective heat transfer or cooling performance. In at least one embodiment, the housing 102 can include a rack mounted system, such as for use with rack mounted computer and/or power equipment, such as a server or an uninterruptible power supply (UPS). In at least one embodiment, the heat generating device 104 can be a central processing unit (CPU), a graphics processing unit (GPU), an insulated-gate bipolar transistor (IGBT), a field effect transistor (FET), another heat generating device, or any combination thereof. In at least one embodiment, one heat sink 110 can be thermally coupled to multiple heat generating devices 104, multiple heat sinks 110 can be thermally coupled to one heat generating device 104, or any combination thereof. For example, one heat sink 110 can be thermally coupled to multiple heat generating devices 104, while another heat sink 110 is thermally coupled to some of those heat generating devices 104.

In at least one embodiment, the diverter 120 can be V-shaped and/or have a V-shaped cross-section. In at least one embodiment, the diverter 120 can present a 120-degree angle. In at least one embodiment, the diverter 120 can present a 90-degree angle. In at least one embodiment, the diverter 120 can present a 60-degree angle. In at least one embodiment, the diverter 120 can present any angle between 0 and 180 degrees. In at least one embodiment, the diverter 120 can be another shape, such as L-shaped, flat, or rounded.

In at least one embodiment, the diverter 120 can be vertically or horizontally oriented. In at least one embodiment, the diverter 120 can be oriented at an angle with respect to a vertical and/or horizontal axis of the housing 102. In at least one embodiment, the diverter 120 can be thermally conductive and thereby provide some heat sink/dissipation itself. In at least one embodiment, the diverter 120 can be electrically insulative. In at least one embodiment, the diverter 120 can be made of metal or plastic.

In at least one embodiment, a system 100 for improved heat dissipation can include multiple diverters 120. In at least one embodiment, one diverter 120 can direct at least a portion of the air flow into multiple heat sinks 110, multiple diverters 120 can direct at least a portion of the air flow into the same heat sink 110, or any combination thereof. For example, one diverter 120 can direct at least a portion of the air flow into multiple heat sinks 110, while another diverter 120 directs at least a portion of the air flow into one or more of those heat sinks 110.

In at least one embodiment, a system 100 for improved heat dissipation can include a first heat generating device 104*a* within the housing 102 and a first heat sink 110*a* thermally coupled to the first heat generating device 104*a*, a second heat generating device 104*b* within the housing 102 and a second heat sink 110*b* thermally coupled to the second heat generating device 104*b*, a first diverter 120*a* positioned between the first heat sink 110*a* and the second heat sink 110*b*, or any combination thereof. In at least one embodiment, the first diverter 120*a* can direct at least a first portion of the air flow into the first heat sink 110*a* and at least a second portion of the air flow into the second heat sink 110*b*.

In at least one embodiment, a system 100 for improved heat dissipation can include a second and/or third diverter 120*b*, 120*c* positioned between the first heat sink 110*a* and the second heat sink 110*b*. In at least one embodiment, the first diverter 120*a* can be positioned upstream or downstream, in the air flow, from the second diverter 120*b*. In at least one embodiment, the second diverter 120*b* can be positioned upstream or downstream, in the air flow, from the third diverter 120*c*. In at least one embodiment, one diverter 120 can be positioned adjacent to (and/or at essentially the same position in the air flow as) another diverter 120.

In at least one embodiment, the second diverter 120*b* can be longer or shorter than the first diverter 120*a*. In at least one embodiment, the third diverter 120*c* can be longer or shorter than the second diverter 120*b*. In at least one embodiment, one diverter 120 can be essentially the same length as another diverter 120. In at least one embodiment, one diverter 120 can be positioned at an angle with respect to another diverter 120. In at least one embodiment, one diverter 120 can be different than another diverter 120. For example, one diverter 120 can be configured to channel air into a heat sink 110, and another diverter can be configured to retain air within that, or another, heat sink 110. In at least one embodiment, the second diverter 120*b* can be configured to direct the first portion of the air flow along the first heat sink 110*a*. In at least one embodiment, the third diverter 120*c* can be configured to direct the second portion of the air flow along the second heat sink 110*b*.

In at least one embodiment, the second diverter 120*b* can be configured to direct at least a third portion of the air flow into the first heat sink 110*a* and direct at least a fourth portion of the air flow into the second heat sink 110*b*. For example, downstream of the first diverter 120 the air flow that was diverted into the first and/or second heat sinks 110*a*, 110*b* may begin to escape those heat sinks 110*a*, 110*b*. Thus, a second diverter 120*b* positioned downstream from the first diverter 120 can redivert all or a portion of the air flow that was diverted into the first and/or second heat sinks 110*a*, 110*b* by the first diverter 120*a*. In at least one embodiment, a second diverter 120*b* positioned downstream from the first diverter 120 can divert even more of the air flow that was diverted into the first and/or second heat sinks 110*a*, 110*b* by the first diverter 120*a*.

In at least one embodiment, a system 100 for improved heat dissipation can include a first heat sink 110*a* and a second heat sink 110*b* thermally coupled to the first heat generating device 104*a*. In at least one embodiment, a system 100 for improved heat dissipation can include a second heat generating device 104*b* within the housing 102, with a third heat sink 110*c* thermally coupled to the second heat generating device 104*b* and/or a fourth heat sink 110*d* thermally coupled to the second heat generating device 104*b*. In at least one embodiment, a first diverter 120*a* can be configured to direct at least a first portion of the air flow into the first heat sink 110*a* and/or direct at least a second portion of the air flow into the third heat sink 110*c*.

In at least one embodiment, a system 100 for improved heat dissipation can include a second diverter 120*b* positioned between the first heat sink 110*a* and the third heat sink 110*c*. In at least one embodiment, a system 100 for improved heat dissipation can include a third diverter 120*c* configured to direct at least a third portion of the air flow into the second heat sink 110*b* and/or the first heat sink 110*a*. In at least one embodiment, a system 100 for improved heat dissipation can include a fourth diverter 120*d* configured to direct at least a fourth portion of the air flow into the fourth heat sink 110*d* and/or the third heat sink 110*c*. In at least one embodiment, a system 100 for improved heat dissipation can include a fifth diverter 120*e* configured to retain the first portion of the air flow within the first heat sink 110*a*. In at least one embodiment, a system 100 for improved heat dissipation can include a sixth diverter 120*f* configured to retain the second portion of the air flow within the third heat sink 110*c*. In at least one embodiment, a system 100 for improved heat dissipation can include any one or more, including all, of the heat sinks 110 and/or diverters 120 described herein.

In at least one embodiment, a diverter 120 can be or include one or more plates for supporting the diversion or channeling of air into or through one or more heat sinks 110 or portions thereof. As shown in FIGS. 28 and 29, for example, diverter 120*d* can be one or more plates for channeling air into both the fourth heat sink 110*d* and the third heat sink 110*c*. As shown in FIGS. 25 and 26, for example, diverter 120*e* can be one or more plates for retaining, or rediverting, air into heat sink 110*a*. As also shown in FIGS. 25 and 26, for example, diverter 120*a* and/or diverter 120*b* can be one or more plates for channeling air into both the first heat sink 110*a* and the third heat sink 110*c*.

In at least one embodiment, a system for improved heat dissipation can include an electronic equipment housing having a heat generating device therein, a fan configured to induce air flow through the housing, a heat sink thermally coupled to the heat generating device, and a diverter positioned to direct at least a portion of the air flow into the heat sink. In at least one embodiment, the diverter can be V-shaped and/or have a V-shaped cross-section. In at least one embodiment, the diverter can be vertically or horizontally oriented. In at least one embodiment, the diverter can be oriented at an angle with respect to a vertical and/or horizontal axis of the housing.

In at least one embodiment, a system for improved heat dissipation can include a second heat generating device within the housing and a second heat sink thermally coupled to the second heat generating device. In at least one embodiment, the diverter can also direct at least a second portion of the air flow into the second heat sink.

In at least one embodiment, a system for improved heat dissipation can include a second and/or third diverter positioned between the first heat sink and the second heat sink. In at least one embodiment, the first diverter can be positioned upstream, in the air flow, from the second diverter. In at least one embodiment, the second diverter can be positioned upstream, in the air flow, from the third diverter. In at least one embodiment, the second diverter can be longer than the first diverter. In at least one embodiment, the third diverter can be longer than the second diverter.

In at least one embodiment, the second diverter can be configured to direct at least a third portion of the air flow into the first heat sink and direct at least a fourth portion of the air flow into the second heat sink. In at least one embodiment, the second diverter can be configured to direct the first portion of the air flow along the first heat sink. In at least one embodiment, the third diverter can be configured to direct the second portion of the air flow along the second heat sink.

In at least one embodiment, a system for improved heat dissipation can include a second heat sink thermally coupled to the first heat generating device. In at least one embodiment, a system for improved heat dissipation can include a second heat generating device within the housing, with a third heat sink thermally coupled to the second heat generating device and/or a fourth heat sink thermally coupled to the second heat generating device. In at least one embodiment, the first diverter can be configured to also direct at least a second portion of the air flow into the third heat sink.

In at least one embodiment, a system for improved heat dissipation can include a second diverter positioned between the first heat sink and the third heat sink. In at least one embodiment, a system for improved heat dissipation can include a third diverter configured to direct at least a third portion of the air flow into the second heat sink. In at least one embodiment, a system for improved heat dissipation can include a fourth diverter configured to direct at least a fourth portion of the air flow into the fourth heat sink.

Other and further embodiments utilizing one or more aspects of the disclosure can be devised without departing from the spirit of Applicants' disclosure. For example, the devices, systems and methods can be implemented for numerous different types and sizes in numerous different industries. Further, the various methods and embodiments of the devices, systems and methods can be included in combination with each other to produce variations of the disclosed methods and embodiments. Discussion of singular elements can include plural elements and vice versa. The order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions.

The inventions have been described in the context of preferred and other embodiments and not every embodiment of the inventions has been described. Obvious modifications and alterations to the described embodiments are available to those of ordinary skill in the art having the benefits of the present disclosure. The disclosed and undisclosed embodiments are not intended to limit or restrict the scope or applicability of the inventions conceived of by the Applicants, but rather, in conformity with the patent laws, Applicants intend to fully protect all such modifications and improvements that come within the scope or range of equivalents of the following claims.

The invention claimed is:

1. A system comprising:
an electronic equipment housing having a first heat generating device and a second heat generating device therein;
a fan configured to induce air flow through the housing;
a first heat sink thermally coupled to the first heat generating device; and
a second heat sink thermally coupled to the second heat generating device; and
a first diverter having an upstream end positioned laterally between the first heat sink and the second heat sink, and configured to direct at least a first portion of the air flow into the first heat sink and direct at least a second portion of the air flow into the second heat sink.

2. The system of claim 1, further comprising a second diverter positioned between the first heat sink and the second heat sink.

3. The system of claim 2, wherein the first diverter is positioned upstream, in the air flow, from the second diverter.

4. The system of claim 2, wherein the second diverter is configured to direct at least a third portion of the air flow into the first heat sink and to direct at least a fourth portion of the air flow into the second heat sink.

5. The system of claim 2, further comprising a third diverter positioned between the first heat sink and the second heat sink, wherein the second diverter is configured to direct the first portion of the air flow along the first heat sink and the third diverter is configured to direct the second portion of the air flow along the second heat sink.

6. The system of claim 2, wherein the second diverter is longer than the first diverter.

7. The system of claim 1, wherein the first heat sink comprises a first plurality of horizontally oriented fins.

8. The system of claim 7, wherein the first plurality of horizontally oriented fins extends towards the first diverter.

9. The system of claim 7, wherein the second heat sink comprises a second plurality of horizontally oriented fins.

10. The system of claim 9, wherein the second plurality of horizontally oriented fins extends towards the first diverter.

11. The system of claim 1, further comprising a second diverter configured to retain the first portion of the air flow within at least a portion of the first heat sink fluidically downstream of the first diverter.

12. The system of claim 7, wherein the first diverter is positioned upstream, in the air flow, from the second diverter.

13. The system of claim 7, wherein the second diverter is configured to direct at least a third portion of the air flow into the first heat sink and to direct at least a fourth portion of the air flow into the second heat sink.

14. The system of claim 7, further comprising a third diverter positioned between the first heat sink and the second heat sink, wherein the second diverter is configured to direct the first portion of the air flow along the first heat sink and the third diverter is configured to direct the second portion of the air flow along the second heat sink.

15. The system of claim 7, wherein the second diverter is longer than the first diverter.

16. The system of claim 12, further comprising a third diverter configured to direct at least a fourth portion of the air flow into the fourth heat sink.

17. The system of claim 13, further comprising a fourth diverter positioned between the first heat sink and the third heat sink.

18. A system comprising:
an electronic equipment housing having a first heat generating device therein;
a second heat generating device within the housing;
a fan configured to induce air flow through the housing;
a first heat sink thermally coupled to the first heat generating device;
a second heat sink thermally coupled to the second heat generating device;
a first diverter positioned to direct at least a first portion of the air flow into the first heat sink and direct at least a second portion of the air flow into the second heat sink; and
a second diverter positioned between the first heat sink and the second heat sink.

19. A system comprising:
an electronic equipment housing having a first heat generating device therein;
a second heat generating device within the housing;
a fan configured to induce air flow through the housing;
a first heat sink thermally coupled to the first heat generating device; and
a second heat sink thermally coupled to the first heat generating device;
a third heat sink thermally coupled to the second heat generating device;
a fourth heat sink thermally coupled to the second heat generating device;
a first diverter positioned to direct at least a first portion of the air flow into the first heat sink and direct at least a second portion of the air flow into the third heat sink; and
a second diverter configured to direct at least a third portion of the air flow into the second heat sink.

20. A system comprising:
an electronic equipment housing having a first heat generating device therein;
a second heat generating device within the housing;
a fan configured to induce air flow through the housing;
a first heat sink thermally coupled to the first heat generating device;
a second heat sink thermally coupled to the first heat generating device;
a third heat sink thermally coupled to the second heat generating device;
a fourth heat sink thermally coupled to the second heat generating device;
a first diverter positioned to direct at least a first portion of the air flow into the first heat sink and direct at least a second portion of the air flow into the third heat sink; and
a second diverter positioned between the first heat sink and the third heat sink.

* * * * *